United States Patent
Na et al.

(10) Patent No.: US 12,430,028 B2
(45) Date of Patent: Sep. 30, 2025

(54) STORAGE DEVICE, STORAGE SYSTEM AND LOGGING METHOD THEREOF

(71) Applicant: Samsung Electronics Co., Ltd., Suwon-si (KR)

(72) Inventors: Jong-Sung Na, Suwon-si (KR); Seona Cho, Suwon-si (KR); Kyungduk Lee, Suwon-si (KR); Sohyun Han, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 18/332,411

(22) Filed: Jun. 9, 2023

(65) Prior Publication Data

US 2024/0192852 A1 Jun. 13, 2024

(30) Foreign Application Priority Data

Dec. 9, 2022 (KR) .................. 10-2022-0171209

(51) Int. Cl.
*G06F 3/06* (2006.01)

(52) U.S. Cl.
CPC ............ *G06F 3/061* (2013.01); *G06F 3/0656* (2013.01); *G06F 3/0679* (2013.01)

(58) Field of Classification Search
CPC ....... G06F 3/061; G06F 3/0656; G06F 3/0679
See application file for complete search history.

(56) References Cited

U.S. PATENT DOCUMENTS

| | | | |
|---|---|---|---|
| 9,535,780 B2 | 1/2017 | Rajamanickam et al. | |
| 10,572,650 B2 | 2/2020 | Cooper et al. | |
| 11,048,581 B2 | 6/2021 | Sinha et al. | |
| 11,050,653 B2 | 6/2021 | Wohlschlegel et al. | |
| 11,334,280 B2 | 5/2022 | Navon et al. | |
| 2010/0262857 A1 | 10/2010 | Enarson et al. | |
| 2016/0019947 A1* | 1/2016 | Pang | G11C 16/3459 365/185.03 |
| 2017/0139765 A1 | 5/2017 | Ko et al. | |
| 2021/0004282 A1* | 1/2021 | Kim | G06F 11/076 |
| 2022/0326887 A1* | 10/2022 | Caraccio | G06F 3/0679 |
| 2022/0328107 A1* | 10/2022 | Chai | G11C 11/5642 |
| 2022/0415415 A1* | 12/2022 | Tseng | G11C 16/26 |

FOREIGN PATENT DOCUMENTS

KR 2021-0083081 A 7/2021

OTHER PUBLICATIONS

Extended European Search Report dated Apr. 30, 2024 for corresponding European Application No. 23204797.7.

* cited by examiner

*Primary Examiner* — Mark A Giardino, Jr.
(74) *Attorney, Agent, or Firm* — Harness, Dickey & Pierce, P.L.C.

(57) ABSTRACT

Disclosed is a storage device, the device comprising, a nonvolatile memory device configured to store data; and a storage controller configured to perform logging for a selected memory area of the nonvolatile memory device in response to a specific event based on receiving a telemetry request from a host, and transmit log data collected by the logging in response to the telemetry request, the storage controller including a logging module configured to sample distribution data of a voltage range corresponding to the event type during the logging and provide the sampled distribution data as the log data.

16 Claims, 18 Drawing Sheets

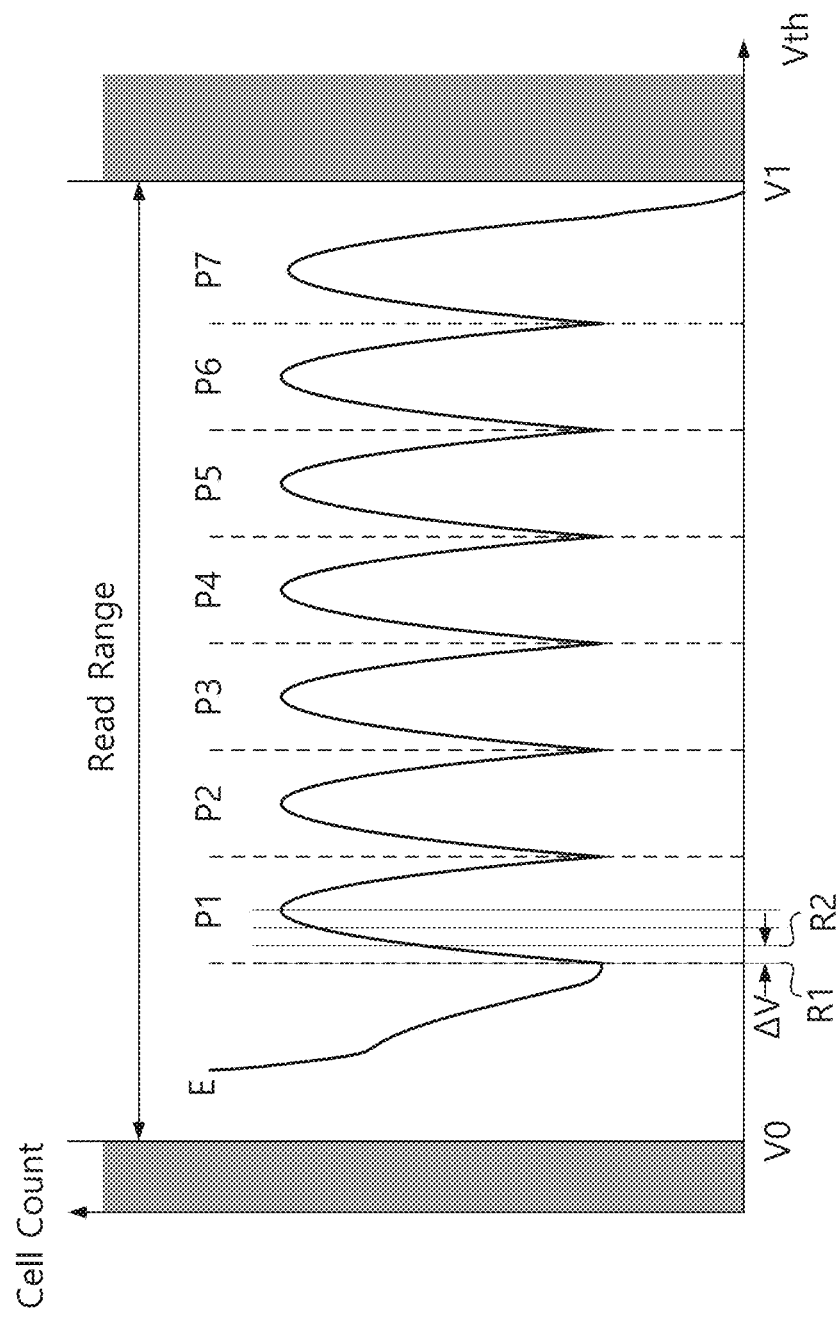

FIG. 9A

Get Log Page – Log Page Identifiers

| Log Identifier | Scope | Log Page Name |
|---|---|---|
| 00h | Reserved | |
| 01h | Controller | Error Information |
| 02h | Controller | SMART / Health Information |
| | Namespace | |
| 03h | NVM Subsystem | Firmware Slot Information |
| 04h | Controller | Changed Namespace List |
| 05h | Controller | Commands Supported and Effects |
| 06h | NVM Subsystem | Device Self-test |
| 07h | Controller | Telemetry Host-Initiated |
| 08h | Controller | Telemetry Controller-Initiated |
| 09h | NVM Subsystem | Endurance Group Information |
| ... | ... | ... |
| 80h to BFh | I/O Command Set Specific | |
| C0h to FFh | * Vendor specific | |
| | D0h – Extended SMART | |

FIG. 9B

Extended SMART

| Bytes | Size | Name | Description |
|---|---|---|---|
| 0:0 | 1 | Log Page ID | 0xD0 |
| 1:1 | 1 | Reserved | Must be 0 |
| 3:2 | 2 | Flags | Flags Bit 0: ..... |
| 7:4 | 4 | Log Page Size | 512 Byte |
| ... | ... | ... | ... |
| 375:276 | 100 | Cell Distribution | 25_cell count in 0.04V units (4 Byte) |
| 511:376 | 136 | Reserved | -- |

Set Feature Command Dword11

| Bits | Description | | |
|---|---|---|---|
| 31:16 | Reserved | | |
| 15:08 | Set range for Logging | | |
| | Value | Description | |
| | 0h | E-P1 (Disturbance read reclaim) | |
| | 1h | E-P1, P4-P5 (LSB Page Reclaim) | |
| | 2h | P2-P3, P6-P7 (MSB Page Reclaim) | |
| | 3h | P6-P7 (Retention) | |
| | ... | ... | |
| 07:00 | Set Event for logging | | |
| | Value | Description | |
| | 0h | Host Read Reclaim Event | |
| | 1h | Patrol Read Reclaim Event | |
| | 2h | UECC event | |
| | ... | ... | |

STORAGE DEVICE, STORAGE SYSTEM AND LOGGING METHOD THEREOF

CROSS-REFERENCE TO RELATED APPLICATIONS

This application claims priority under 35 U.S.C. § 119 to Korean Patent Application No. 10-2022-0171209 filed on Dec. 9, 2022, in the Korean Intellectual Property Office, the disclosures of which are incorporated by reference herein in their entireties.

BACKGROUND

Embodiments of the present disclosure described herein relate to semiconductor memory devices, and more particularly, to storage devices for transmitting telemetry logging data, storage systems, and logging methods thereof.

A representative example of a flash memory-based mass storage device is a solid state drive (hereinafter referred to as SSD). Along with the explosive increase in demand for SSD, its uses are diversifying. For example, uses may be subdivided into SSDs for servers, SSDs for clients, and SSDs for data centers. The SSD's interface must be able to provide optimal speed and reliability for each of these uses. To meet these demands, various interface technologies such as SATA, SAS, and PCIe-based NVMe are being applied.

Recently, SSD interfaces are being actively developed to provide ease of expansion in a system such as a large-capacity data center. In particular, NVMe-oF (NVMe over Fabrics) specifications are being actively applied as a standard for mounting SSDs on network fabrics such as Ethernet switches. NVMe-oF supports the NVMe storage protocol over a wide range of storage networking fabrics (e.g., Ethernet, Fiber Channel, InfiniBand, etc.). In addition, the NVMe-MI specification is applied as an interface for drive management such as monitoring, updating, and firmware search of storage devices connected to NVMe.

To manage the SSD, the manager periodically receives and analyzes the telemetry data generated inside the SSD through the network. However, although this is an important item for determining the state of the SSD, there may be data that takes a lot of time during internal data logging. When the logging data is transmitted, latency during operation of the SSD is increased, and thus performance of the SSD may be greatly deteriorated. Accordingly, there is a need for a logging technology of telemetry data without deterioration of performance or quality of service QoS from the viewpoint of health care of SSD.

SUMMARY

Embodiments of the present disclosure provide storage devices, storage systems, and logging methods thereof for providing telemetry logging data capable of minimizing performance degradation.

According to some example embodiments, a storage device, the device comprising, a nonvolatile memory device configured to store data; and a storage controller configured to perform logging for a selected memory area of the nonvolatile memory device in response to a specific event based on receiving a telemetry request from a host, and transmit log data collected by the logging in response to the telemetry request, the storage controller including a logging module configured to sample distribution data of a voltage range corresponding to the event type during the logging and provide the sampled distribution data as the log data.

According to some example embodiments, a storage system, comprising, a storage device including a nonvolatile memory device and configured to collect log data by performing logging on the nonvolatile memory device, and a host device configured to communicate with the storage device through a network and obtain the log data by transmitting a telemetry request to the storage device, the host device is configured to control the storage device to log a cell distribution in a voltage range corresponding to some of data states of a selected memory area using a set feature command, and provide the log data as log data.

According to some example embodiments, a logging method of a storage device having a nonvolatile memory device, comprising, receiving a set feature command provided from a host, setting a logging policy to log distribution data of a voltage range corresponding to some data states of the nonvolatile memory device according to the set feature command, and performing logging for the nonvolatile memory device according to the set logging policy, wherein the some of the data states is determined according to an event occurring in a storage state.

BRIEF DESCRIPTION OF THE FIGURES

The above and other objects and features of the present disclosure will become apparent by describing in detail some example embodiments thereof with reference to the accompanying drawings.

FIGS. 7A, 7B, and 7C are diagrams illustrating an adjusted logging policy according to some example embodiments the present disclosure.

FIGS. 9A and 9B are tables showing set feature commands for adjusting the logging settings of FIG. 8.

FIG. 10 is a table showing detailed settings for logging in the set feature command according to some example embodiments of the present disclosure.

DETAILED DESCRIPTION

It is to be understood that both the foregoing general description and the following detailed description are examples, and it is to be considered that an additional description of the claimed disclosure is provided. Reference signs are indicated in detail in example embodiments of the present disclosures, examples of which are indicated in the reference drawings. Wherever possible, the same reference numbers are used in the description and drawings to refer to the same or like parts.

Figure 1:
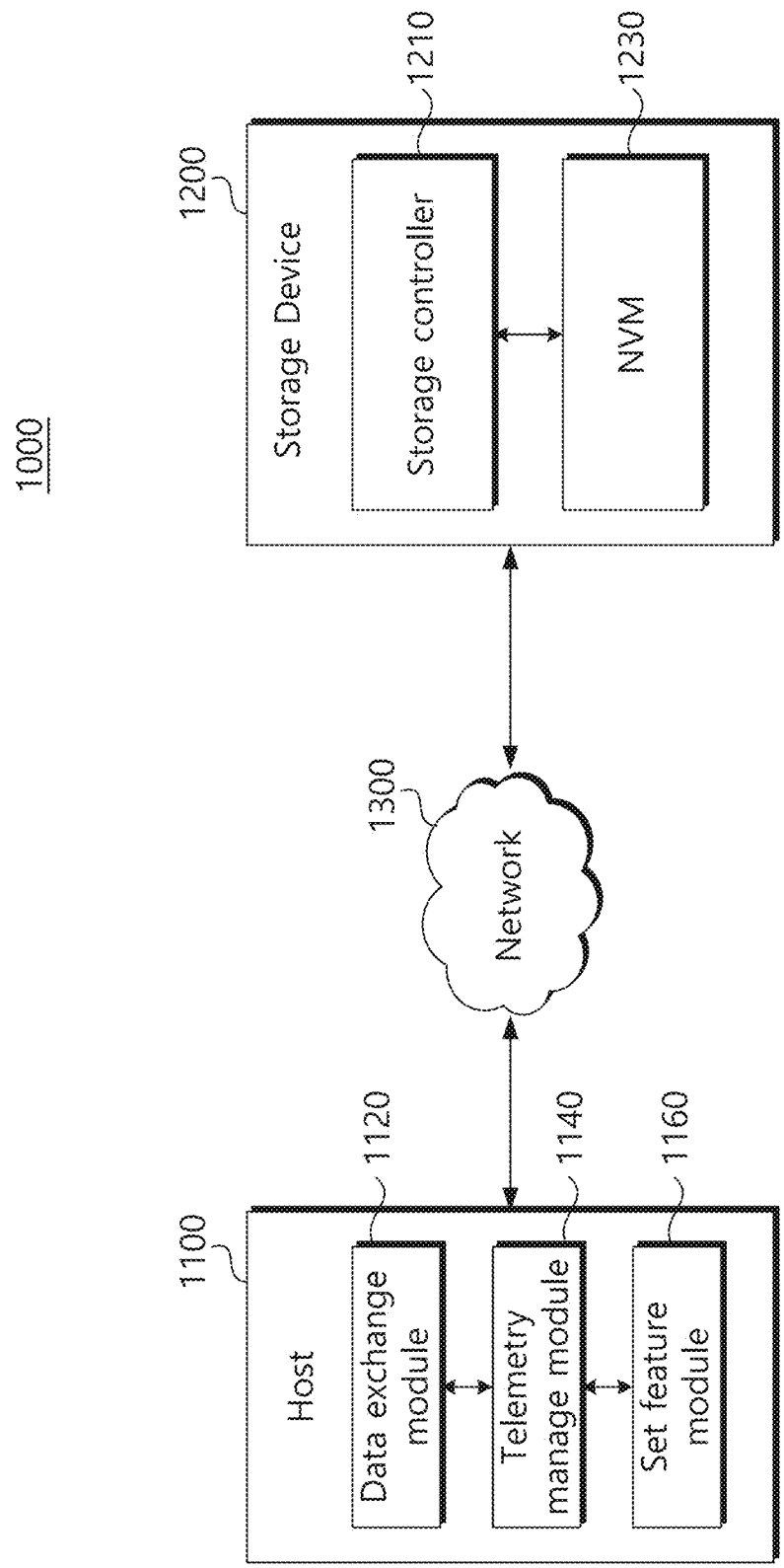
FIG. 1 is a block diagram showing a storage system according to some example embodiments of the present disclosure.

FIG. 1 is a block diagram showing a storage system according to some example embodiments of the present disclosure. Referring to FIG. 1, a storage system 1000 may include a host 1100, a storage device 1200, and a network 1300.

The host 1100 accesses the storage device 1200 through the network 1300 and requests telemetry data. The host 1100 may receive telemetry data transmitted from the storage device 1200 and provide it to a manager. To request and receive telemetry data, the host 1100 may include a data exchange module 1120 and a telemetry management module 1140 for requesting and receiving telemetry data. The interface used in the data exchange module 1120 may be at least one of NVMe, NVMe over Fabrics (NVMe-oF), and NVMe-Management Interface (NVMe-MI).

In particular, the host 1100 may adjust a logging configuration for sampling telemetry data of the storage device 1200. The set feature module 1160 may control the logging range of the storage device 1200 by setting the logging of the storage device 1200. For example, the host 1100 may use the set feature module 1160 to log only some voltage ranges among distribution data of the storage device 1200. This adjustment may be accomplished using a set feature command provided by the set feature module 1160.

The storage device 1200 may be provided as a storage medium of a server or data center. The storage device 1200 writes data into the nonvolatile memory device 1230 or reads stored data in response to various data write and read requests. The storage device 1200 may include a storage controller 1210 and a nonvolatile memory device 1230.

The storage controller 1210 may be configured to control the nonvolatile memory device 1230. For example, the storage controller 1210 may write data into the nonvolatile memory device 1230 or read data stored in the nonvolatile memory device 1230 according to a request of the host 1100. To access the nonvolatile memory device 1230, the storage controller 1210 may provide commands, addresses, data, and control signals to the nonvolatile memory device 1230.

In particular, the storage controller 1210 may include a Flash Translation Layer FTL that performs garbage collection. Disadvantages of the nonvolatile memory device 1230 such as erase-before-write and inconsistency between an erase unit and a write unit may be supplemented by the flash translation layer FTL. In addition, the flash translation layer FTL maps a logical address generated by a file system of the host 1100 to a physical address of the nonvolatile memory device 1230. In addition, the flash translation layer FTL performs wear leveling for managing the lifetime of the nonvolatile memory device 1230 or garbage collection for managing data capacity.

The storage controller 1210 of the present disclosure may adjust the logging policy of the storage device 1200 in response to a set feature command from the host 1100. That is, the storage controller 1210 may set the size or extraction range of log data extracted during logging by the set feature command. Here, log data refers to events that occur during operation of the storage device 1200 or state data at the time of an event, and logging refers to an operation of collecting such log data. Telemetry will be defined as an operation of transmitting log data collected by logging to the host 1100 via the network 1300.

For example, the storage controller 1210 may log threshold voltage distribution data for a corresponding memory area when an event such as read reclaim occurs. In this case, the storage controller 1210 of the present disclosure may perform logging for a partial voltage range in which the cause of the event can be identified, rather than for the entire threshold voltage range in which data states are distributed. Such logging settings may be performed in the storage controller 1210 through the set feature command provided by the host 1100.

The nonvolatile memory device 1230 may store data received from the storage controller 1210 or transmit stored data to the storage controller 1210 under the control of the storage controller 1210. The nonvolatile memory device 1230 may include a plurality of memory blocks BLK1 to BLKi. Each of the plurality of memory blocks BLK1 to BLKi has a 3D memory structure in which word line layers are stacked in a direction perpendicular to the substrate. Each of the plurality of memory blocks BLK1 to BLKi may be managed by the storage controller 1210 through wear leveling information such as an erase count EC.

The network 1300 may be an Ethernet communication network. The host 1100 and the storage device 1200 may be connected to the network 1300 through an Ethernet switch. However, the present disclosure is not limited thereto, and the network 1300 may be one or more of arbitrary wired/wireless networks such as a local area network LAN, a wide area network WAN, and Wi-Fi.

According to some example embodiments, the storage device 1200 of the present disclosure may be configured to log only a partial logging range in which the cause of a problem can be analyzed in the case of logging with a large load that causes performance degradation. Through these settings, the storage device 1200 may log and transmit the cell threshold voltage distribution only in a certain voltage range when an event such as read reclaim occurs. Accordingly, logging items that require a long logging time or logging that causes a large load can be executed without degrading performance of the storage device 1200. For example, the example embodiments of the present disclosure may improve storage utilization (for example, by reducing storage of logging ranges), improve processing utilization (for example, by limiting resources required to manage and monitor logging), improve energy usage, improve network utilization (for example, by transmitting/receiving the reduced partial logging range data) of the storage system 1000 and/or other components.

Figure 2:
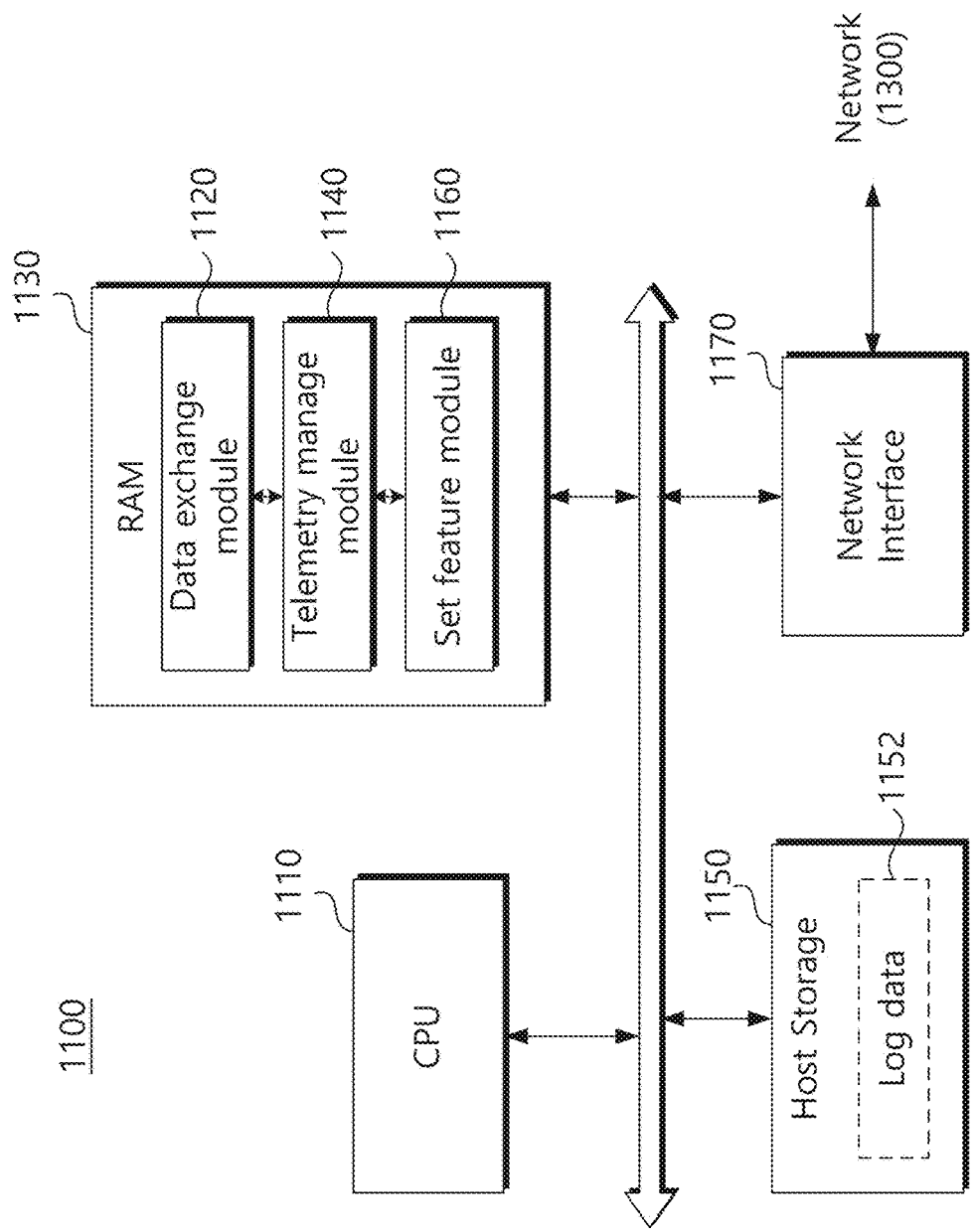
FIG. 2 is a block diagram showing the host of FIG. 1 according to some example embodiments.

FIG. 2 is a block diagram showing the host of FIG. 1 according to some example embodiments. Referring to FIG. 2, a host 1100 may include a CPU 1110, a working memory 1130, a host storage 1150, and a network interface 1170.

The CPU 1110 may execute software such as various application programs or an operating system OS for controlling the hardware of the host 1100. In particular, the CPU 1110 executes the data exchange module 1120, the telemetry management module 1140, and the set feature module 1160 loaded into the working memory 1130. The CPU 1110 stores log data 1152 collected by the telemetry management module 1140 in the host storage 1150. Also, the CPU 1110 may communicate with the storage device 1200 via the network 1300 through the network interface 1170.

According to the execution of the data exchange module 1120, the CPU 1110 may exchange user data with the storage device 1200. That is, when data writing or data reading access to the storage device 1200 is required, transmission data may be encoded into packets or received data may be decoded by the data exchange module 1120. According to execution of the telemetry management module 1140, the CPU 1110 may request a log page or log data from the storage device 1200 or may receive the requested log data. The received log data 1152 may be stored in the host storage 1150. The set feature module 1160 may adjust or change the logging policy of the storage device 1200. In particular, according to some example embodiments of the present disclosure, the set feature module 1160 configures a logging policy to sample threshold voltage distribution data of memory cells collected in the storage device 1200 within a specific voltage range when an event such as read reclaim occurs.

The host storage 1150 may store log data 1152 collected from the host 1100 or various telemetry data. The stored data may be provided to the user and used to analyze the state of the storage device 1200.

The network interface 1170 provides a communication interface between the host 1100 and the storage device 1200 via the network 1300.

According to some example embodiments of the configuration of the host 1100 described above, the host 1100 may configure logging settings for the storage device 1200 to adjust the logging range. Accordingly, the host 1100 may change the logging policy of the storage device 1200 to log only threshold voltage distribution data in a certain voltage range that can interpret the state when logging items that take a long time, such as threshold voltage distribution data. By changing the logging policy, the host 1100 of the present disclosure enables logging without affecting performance even when logging attributes requiring a large load on the storage device 1200. For example, the example embodiments of the present disclosure may improve storage utilization (for example, by reducing storage of logging ranges), improve processing utilization (for example, by limiting resources required to manage and monitor logging), improve energy usage, improve network utilization (for example, by transmitting/receiving the reduced partial logging range data) of the host 1100 and/or other components.

Figure 3:
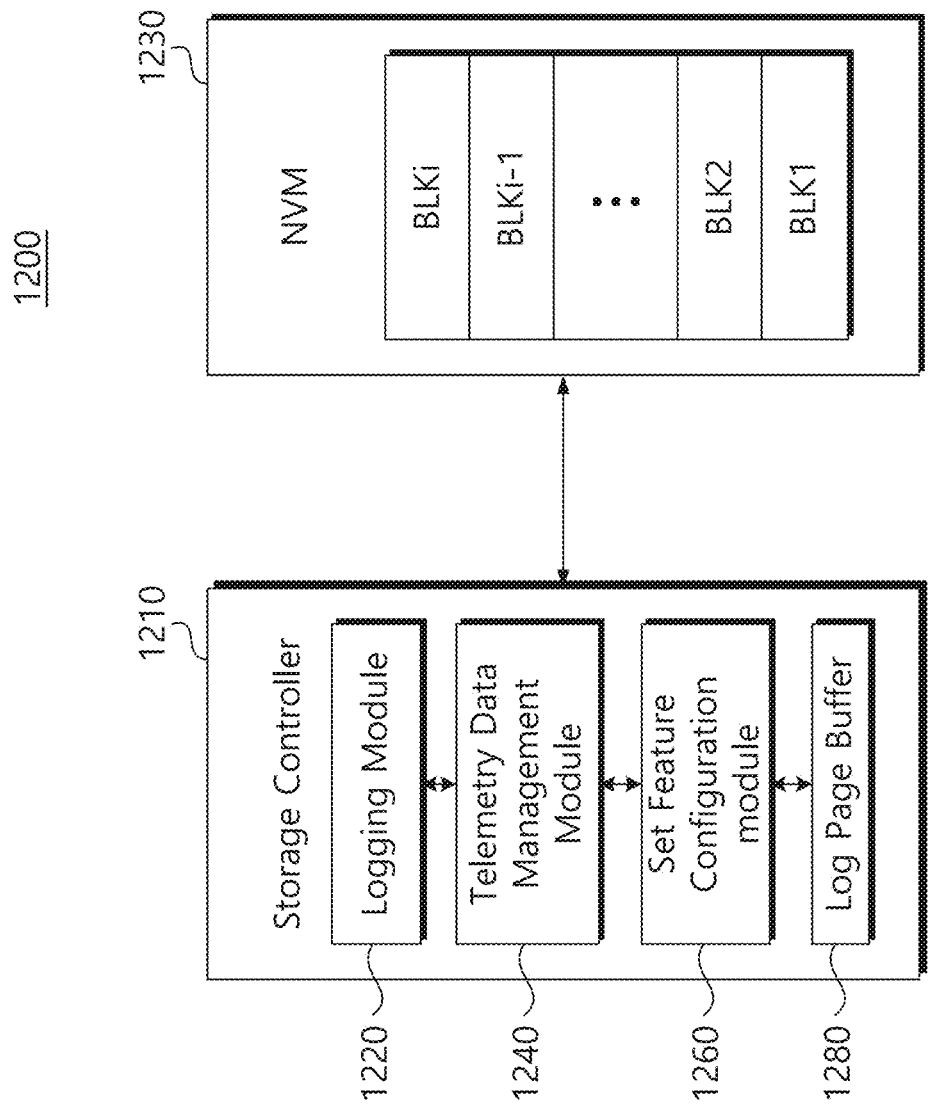
FIG. 3 is a block diagram showing a storage device according to an example embodiment of the present disclosure.

FIG. 3 is a block diagram showing a storage device according to an example embodiment of the present disclosure. Referring to FIG. 3, a storage device 1200 includes a storage controller 1210 and a nonvolatile memory device 1230. For example, each of the storage controller 1210 and the nonvolatile memory device 1230 may be provided as one chip, one package, or one module. Alternatively, the storage controller 1210 and the nonvolatile memory device 1230 may be formed as one chip, one package, or one module, and may be used for storage such as an embedded memory, a memory card, a memory stick, or a solid state drive SSD.

The storage controller 1210 may be configured to control the nonvolatile memory device 1230. For example, the storage controller 1210 may write data to the nonvolatile memory device 1230 or read data stored in the nonvolatile memory device 1230 according to a request of a host 1100. To access the nonvolatile memory device 1230, the storage controller 1210 may provide commands, addresses, data, and control signals to the nonvolatile memory device 1230.

In particular, the storage controller 1210 may adjust a logging policy of the storage device 1200 in response to a set feature command from the host 1100. That is, the storage controller 1210 may set the size or range of log data collected when a specific event occurs. The storage controller 1210 may transmit the collected log data to the host 1100 in response to the telemetry request. For this function, the storage controller 1210 may include a logging module 1220, a telemetry data management module 1240, a set feature configuration module 1260, and a log page buffer 1280.

The logging module 1220 collects log data related to events occurring in the nonvolatile memory device 1230 according to the logging policy set by the set feature configuration module 1260. The collected log data will be stored in the log page buffer 1280. When an event such as read reclaim occurs, the logging module 1220 may log distribution data for a corresponding memory area (memory block or page). In this case, the logging module 1220 may log cell distribution in a voltage range of a state related to a specific event among data states.

For example, when read reclaim occurs, the logging module 1220 may log a cell distribution of a voltage range including only the erase state (E) and the program state (P1). This is because problems caused by program or read disturbance can be identified by checking only the distribution of the erased state (E) and the program state (P1). If a cell distribution problem due to retention is suspected, the logging module 1220 may log a distribution of voltage ranges including top program states (P6 and P7 based on a triple-level call (TLC)). This is because retention, which occurs when the elapsed time after programming exceeds a specific time, is large (e.g., remarkable) in upper program states. In this way, the logging module 1220 performs logging in the logging range reduced by the set feature configuration module 1260. A logging operation in this reduced logging range will not affect the performance of the storage device 1200.

The telemetry data management module 1240 stores the log data collected by the logging module 1220 in the log page buffer 1280. When a telemetry request is generated from the host 1100, the telemetry data management module 1240 will deliver the log page corresponding to the requested identifier among the log data stored in the log page buffer 1280 to the host 1100.

The set feature configuration module 1260 may set a logging policy of the storage device 1200 in response to a set feature command from the host 1100. In particular, the set feature configuration module 1260 may perform logging to obtain distribution information in a voltage range corresponding to some of the data states. Setting of such a logging policy may be performed by the set feature configuration module 1260 according to a set feature command provided from the host 1100.

The log page buffer 1280 stores log data extracted as a result of logging performed in the storage device 1200. The log page buffer 2280 classifies and stores each data extracted by logging by an identifier, and returns it to the host 1100 upon request.

The logging module 1220, the telemetry data management module 1240, the set feature configuration module 1260, and the log page buffer 1280 may be configured as hardware modules constituting the storage controller 1210. In some example embodiments, the logging module 1220, the telemetry data management module 1240, and the set feature configuration module 1260 may be implemented as software modules executed by a processor in the storage controller 1210.

The nonvolatile memory device 1230 may store data received from the storage controller 1210 or transmit stored data to the storage controller 1210 under the control of the storage controller 1210. The nonvolatile memory device 1230 may include a plurality of memory blocks BLK1 to BLKi. Each of the plurality of memory blocks BLK1 to BLKi has a 3D memory structure in which word line layers are stacked in a direction perpendicular to the substrate.

According to some example embodiments of the present disclosure, the storage device 1200 may correct the logging policy according to the set feature command from the host 1100. In particular, the storage device 1200 may perform logging of distribution information only in a voltage range corresponding to some data states. Accordingly, the storage device 1200 may provide the host 1100 with low-size logging data capable of identifying a cause of a problem in response to a telemetry request without performance degradation.

Figure 4:
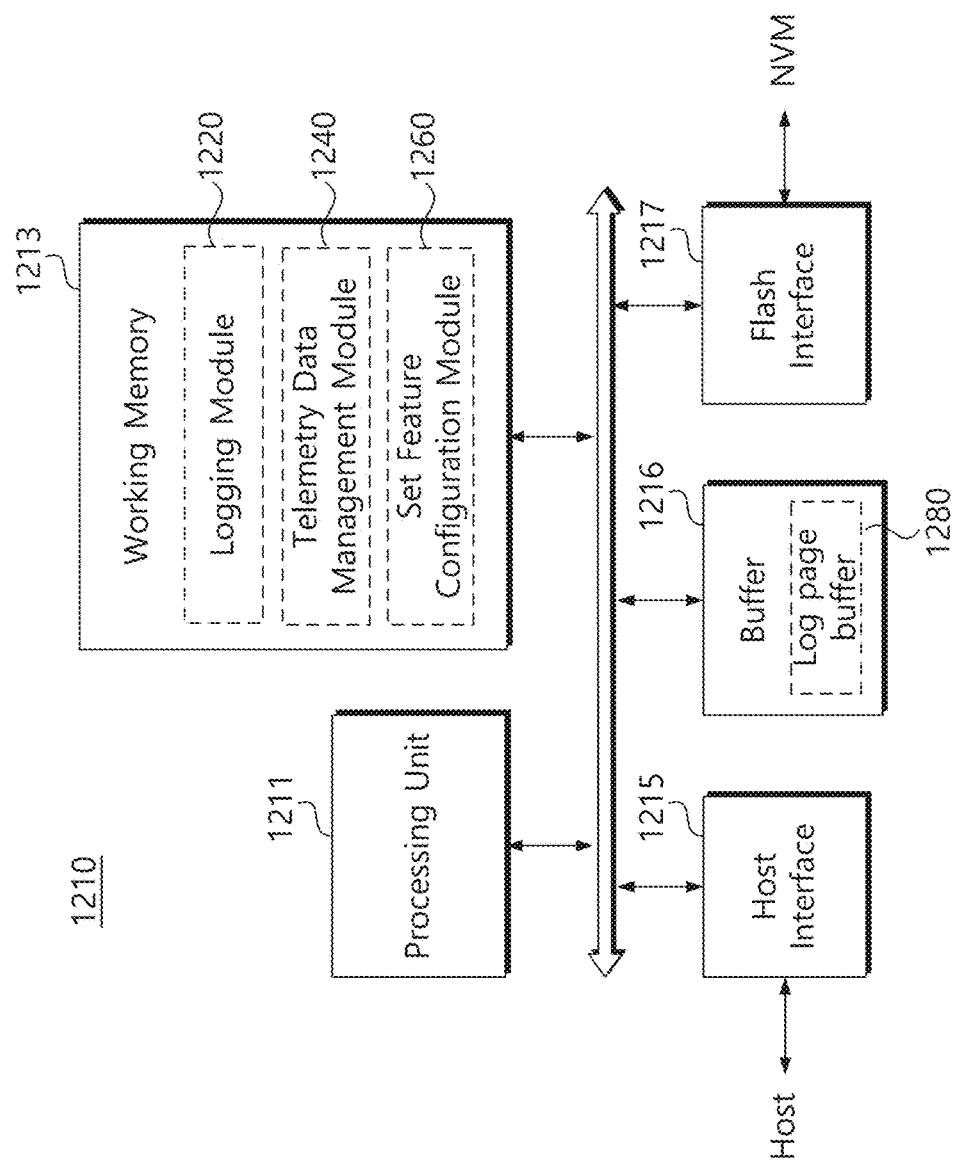
FIG. 4 is a block diagram showing the configuration of the storage controller of FIG. 3.

FIG. 4 is a block diagram showing the configuration of the storage controller of FIG. 3. Referring to FIG. 4, the storage controller 1210 of the present disclosure includes a processing unit 1211, a working memory 1213, a host interface 1215, a buffer 1216, and a flash interface 1217. However, it will be well understood that the components of the storage controller 1210 are not limited to the aforementioned components. For example, the storage controller 1210 may further include a read only memory ROM for storing code data necessary for a booting operation or an error correction code ECC block.

The processing unit 1211 may include a central processing unit CPU or a microprocessor. The processing unit 1211 may drive software or firmware for driving the storage controller 1210. In particular, the processing unit 1211 may drive software loaded into the working memory 1213. For example, the processing unit 1211 may execute a logging module 1220, a telemetry data management module 1240, and a set feature configuration module 1260. In addition, the processing unit 1211 may execute core functions of the storage device 1200 such as a flash translation layer FTL.

Software (or firmware) or data for controlling the storage controller 1210 is loaded into the working memory 1213. Software and data loaded into the working memory 1213 are driven or processed by the processing unit 1211. In particular, according to some example embodiments of the present disclosure, the logging module 1220, the telemetry data management module 1240, and the set feature configuration module 1260 may be loaded into the working memory 1213. Alternatively, a flash translation layer FTL including functions of the logging module 1220, the telemetry data management module 1240, and the set feature configuration module 1260 may be loaded. The working memory 1213 may be implemented with SRAM, for example.

The logging module 1220 driven by the processing unit 1211 collects and stores log data related to events occurring in the nonvolatile memory device 1230 under conditions set by the set feature configuration module 1260. For example, when an event such as read reclaim occurs, the logging module 1220 may log distribution information for a corresponding memory area (memory block or page). In this case, the logging module 1220 may log a cell threshold voltage distribution of a voltage range related to a specific event among threshold voltage distributions corresponding to each data state.

The logging module 1220 may log cell distribution in a voltage range including only the erase state E and the lowest program state P1 when read reclaim occurs. On the other hand, when retention is suspected, the logging module 1220 may log the cell distribution of the voltage range including the highest program states P6 and P7. The logging module 1220 may perform logging in the voltage range reduced by the set feature configuration module 1260.

The telemetry data management module 1240 stores log pages collected by the logging module 1220 in the buffer 1216. When a telemetry request is generated from the host 1100, the telemetry data management module 1240 transfers the log page stored in the buffer 1216 to the host 1100.

The set feature configuration module 1260 may set a logging policy of the storage device 1200 in response to a set feature command from the host 1100. The set feature configuration module 1260 may perform logging to obtain distribution information of some states reflecting characteristics of events among data states. Such logging policy setting may be performed by the set feature configuration module 1260 according to a set feature command provided from the host 1100.

The host interface 1215 provides an interface between a host and the storage controller 1210. The host and the storage controller 1210 may be connected through one of various standardized interfaces. Here, the standard interfaces include ATA (Advanced Technology Attachment), SATA (Serial ATA), e-SATA (external SATA), SCSI (Small Computer Small Interface), SAS (Serial Attached SCSI), PCI (Peripheral Component Interconnection), PCIe (PCI Express), USB (Universal Serial Bus), IEEE 1394, UFS (Universal Flash Storage), eMMC (Embedded Multi Media Card), NVMe, NVMe-of, and NVMe-MI.

The buffer 1216 provides a buffer function for read data or write data moving between the host interface 1215 and the flash interface 1217. The buffer 1216 may be implemented with a relatively large-capacity DRAM in consideration of performance. In particular, a portion of the buffer 1216 may serve as a log page buffer 1280. Log pages extracted by logging performed by the logging module 1220 are stored in the log page buffer 1280. Log pages stored by the telemetry data management module 1240 may be returned to the requested host 1100.

The flash interface 1217 provides an interface between the storage controller 1210 and the nonvolatile memory device 1230. For example, data processed by the processing unit 1211 is stored in the nonvolatile memory device 1230 through the flash interface 1217. As another example, data stored in the nonvolatile memory device 1230 may be exchanged with the storage controller 1210 through the flash interface 1217.

Some example embodiments of the storage controller 1210 have been described above. According to the function of the storage controller 1210 of the present disclosure, a logging policy may be adjusted by a set feature command of the host 1100. In particular, when logging to extract distribution information, the storage device 1200 may be configured to log only distribution information corresponding to some states reflecting event characteristics. In this case, performance degradation of the storage device 1200 due to logging hardly occurs.

Figure 5:
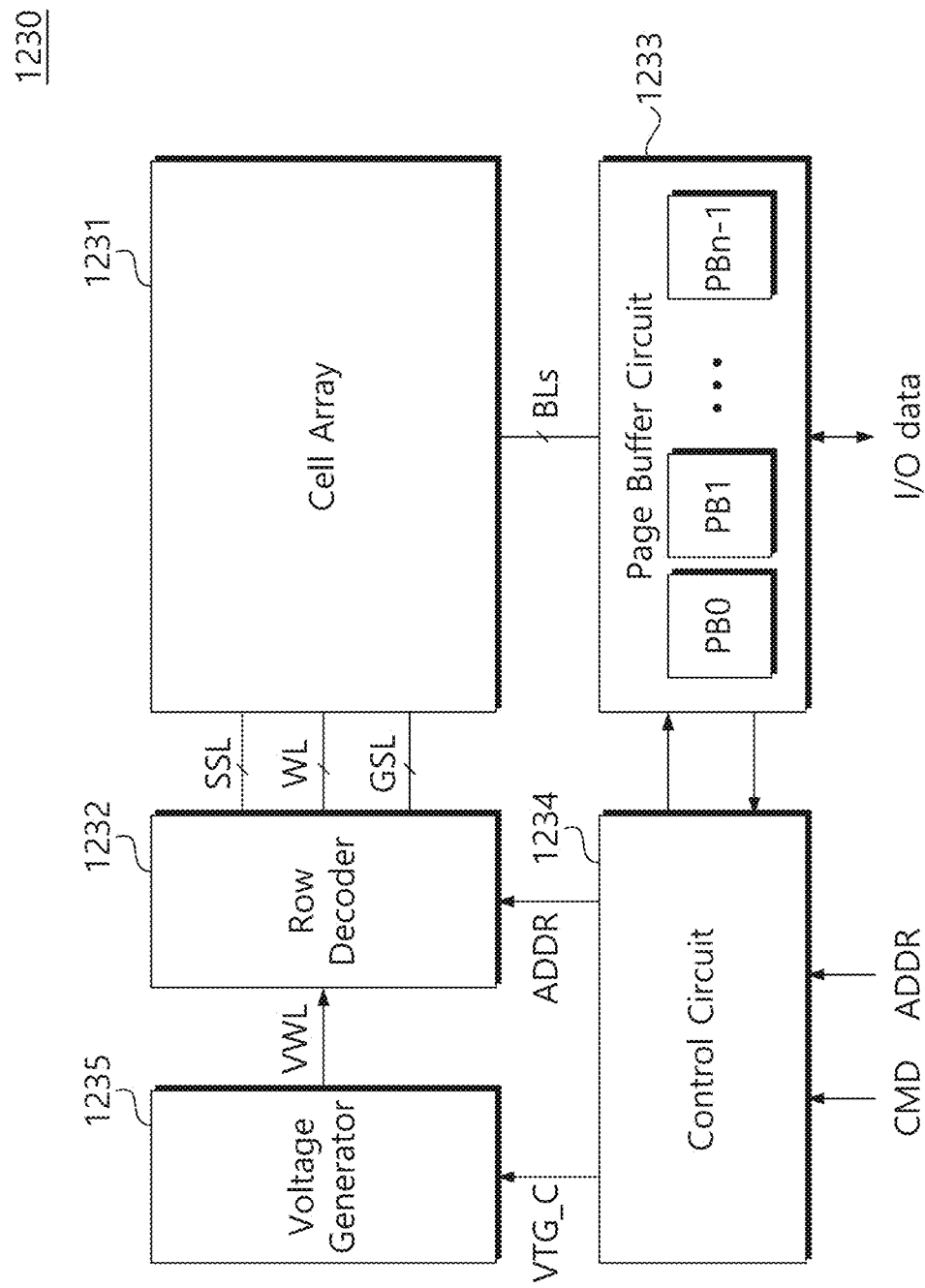
FIG. 5 is an example block diagram of the nonvolatile memory device of FIG. 3.

FIG. 5 is an example block diagram of the nonvolatile memory device of FIG. 3. Referring to FIG. 3, a nonvolatile memory device 1230 may include a cell array 1231, a row decoder 1232, a page buffer circuit 1233, a control logic circuit 1234, and a voltage generator 1235. Although not shown in FIG. 5, the nonvolatile memory device 1230 may further include a data input/output circuit or an input/output interface. Also, the nonvolatile memory device 1230 may further include elements such as a column logic, a pre-decoder, a temperature sensor, a command decoder, and an address decoder.

The cell array 1231 may include a plurality of memory blocks. Each of the plurality of memory blocks may include a plurality of memory cells. A plurality of memory blocks may be included in one memory plane, but the present disclosure is not limited thereto. The cell array 1231 may be connected to the page buffer circuit 1233 through bit lines BL, and may be connected to the row decoder 1232 through word lines WL, string select lines SSL, and ground select lines GSL. In some example embodiments, the cell array 1231 may include a 3D memory cell array.

The row decoder 1232 may select one of the memory blocks of the cell array 1231 in response to the address ADDR. The row decoder 1232 may select one of the word lines of the selected memory block in response to the address ADDR. The row decoder 1232 transfers the voltage VWL corresponding to the operation mode to the word line of the selected memory block. During a program operation, the row decoder 1232 transfers the program voltage Vpgm and the verify voltage Vfy to the selected word line and the pass voltage Vpass to the unselected word line. During a read operation, the row decoder 1232 transfers the read voltage Vrd to the selected word line and the read pass voltage Vread to the unselected word line.

The page buffer circuit 1233 may include a plurality of page buffers PB0 to PBn−1. The plurality of page buffers PB0 to PBn−1 may be respectively connected to memory cells through a plurality of bit lines BL. The page buffer circuit 1233 may select at least one bit line from among the bit lines BLs in response to the column address. The page buffer circuit 1233 may operate as a write driver or a sense amplifier according to an operation mode. For example, during a program operation, the page buffer circuit 1233 may apply a bit line voltage corresponding to data to be programmed to a selected bit line. During a read operation, the page buffer circuit 1233 may sense data stored in a memory cell by sensing a current or voltage of a selected bit line.

The control logic circuit 1234 may generally control various operations within the nonvolatile memory device 1230. The control logic circuit 1234 programs data into the cell array 1231 in response to a control signal CTRL, a command CMD, and/or an address ADDR. The control logic circuit 1234 reads data from the cell array 1231, or generates various control signals for erasing data stored in the cell array 1231. For example, the control logic circuit 1234 may output a voltage control signal VTG_C, an address ADDR, and the like. In some example embodiments, the control logic circuit 1234 may output control signals for programming multi-bit data according to a received control signal CTRL, command CMD, and/or address ADDR.

The voltage generator 1235 may generate various types of voltages for performing program, read, and erase operations based on the voltage control signal VTG_C. For example, the voltage generator 1235 may generate a program voltage, a read voltage, a program verify voltage, and the like as the word line voltage VWL. For example, the program voltage may be generated in a form for applying an incremental step pulse program ISPP.

Figure 6:
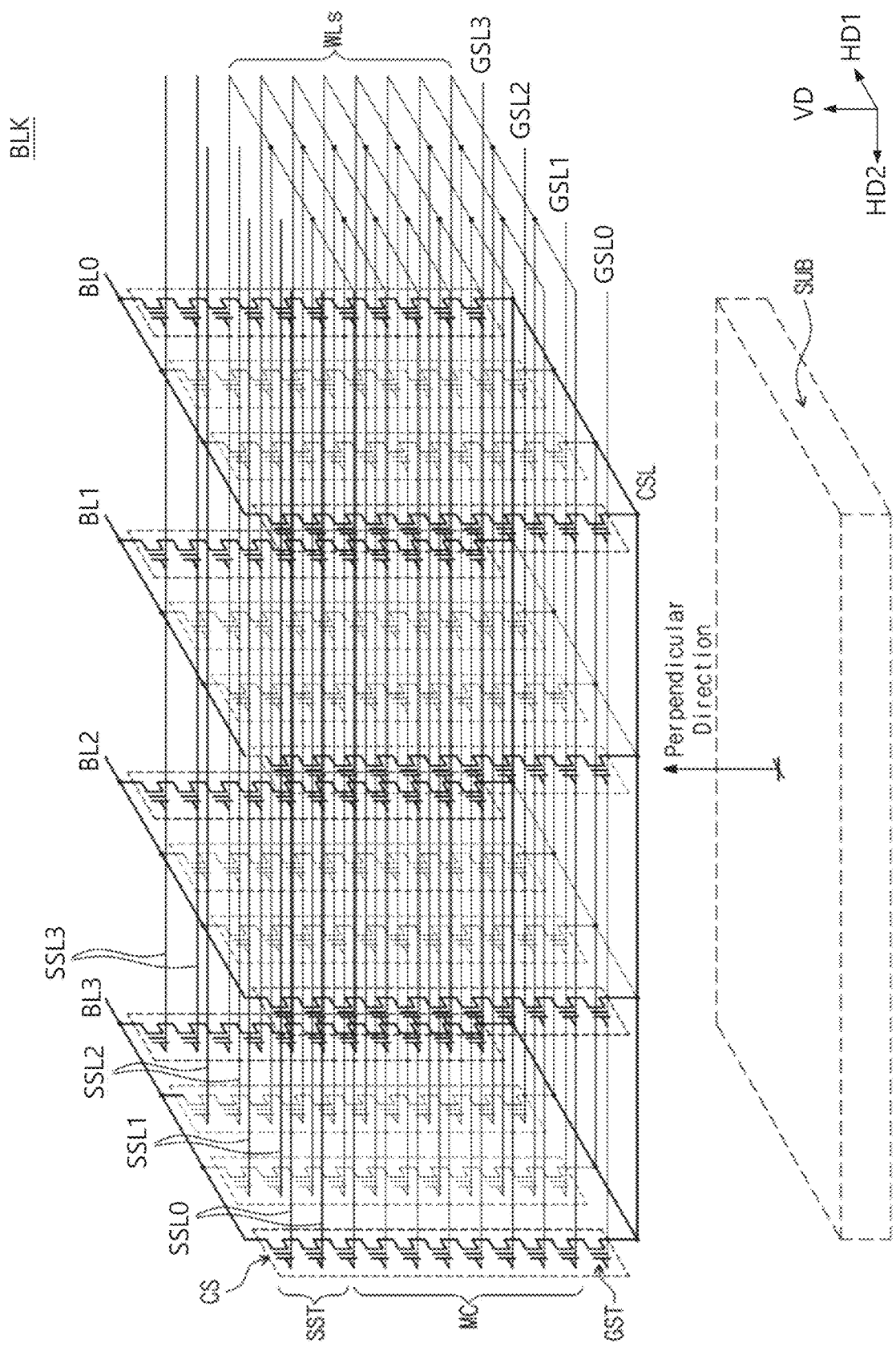
FIG. 6 is a circuit diagram showing an example structure of a memory block constituting the cell array of FIG. 5.

FIG. 6 is a circuit diagram showing an example structure of a memory block constituting the cell array of FIG. 5. Referring to FIG. 5, cell strings CS are formed between the bit lines BL0, BL1, BL2, and BL3 and the common source line CSL to form the memory block BLK.

A plurality of cell strings are formed between the bit line BL0 and the common source line CSL. The string select transistors SST of the cell strings CS are connected to the corresponding bit lines BL. The ground selection transistors GST of the cell strings CS are connected to the common source line CSL. Memory cells MCs are provided between the string select transistor SST and the ground select transistor GST of the cell string CS.

Each of the cell strings CS includes a ground select transistor GST. Ground select transistors included in the cell strings CS may be controlled by the ground select line GSL. Alternatively, although not shown, cell strings corresponding to each row may be controlled by different ground selection lines.

Some example embodiments of the circuit structure of memory cells included in one memory block BLK have been described. However, the illustrated circuit structure of the memory block is only a simplified structure for convenience of description, and an actual memory block is not limited to the illustrated example. That is, it will be well understood that one physical block may include more semiconductor layers, bit lines, and string select lines.

Figure 7B:
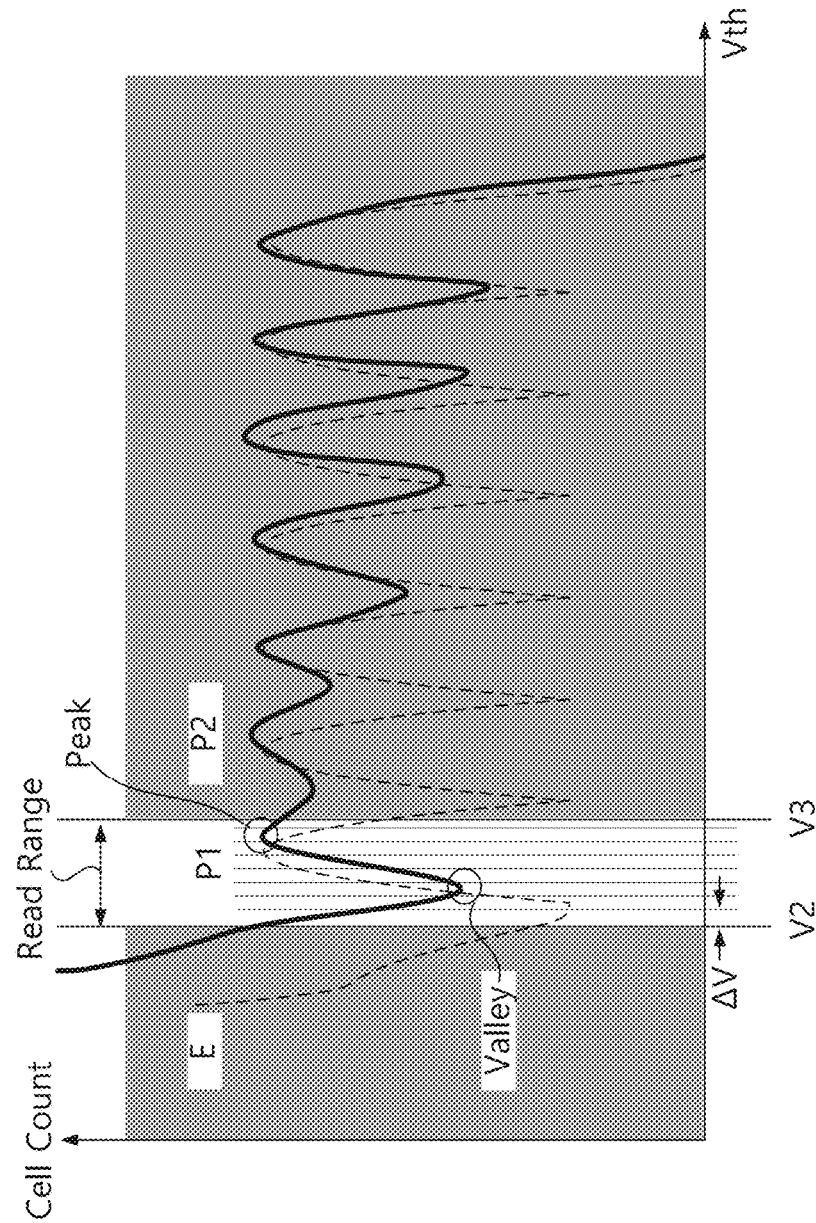
Figure 7C:
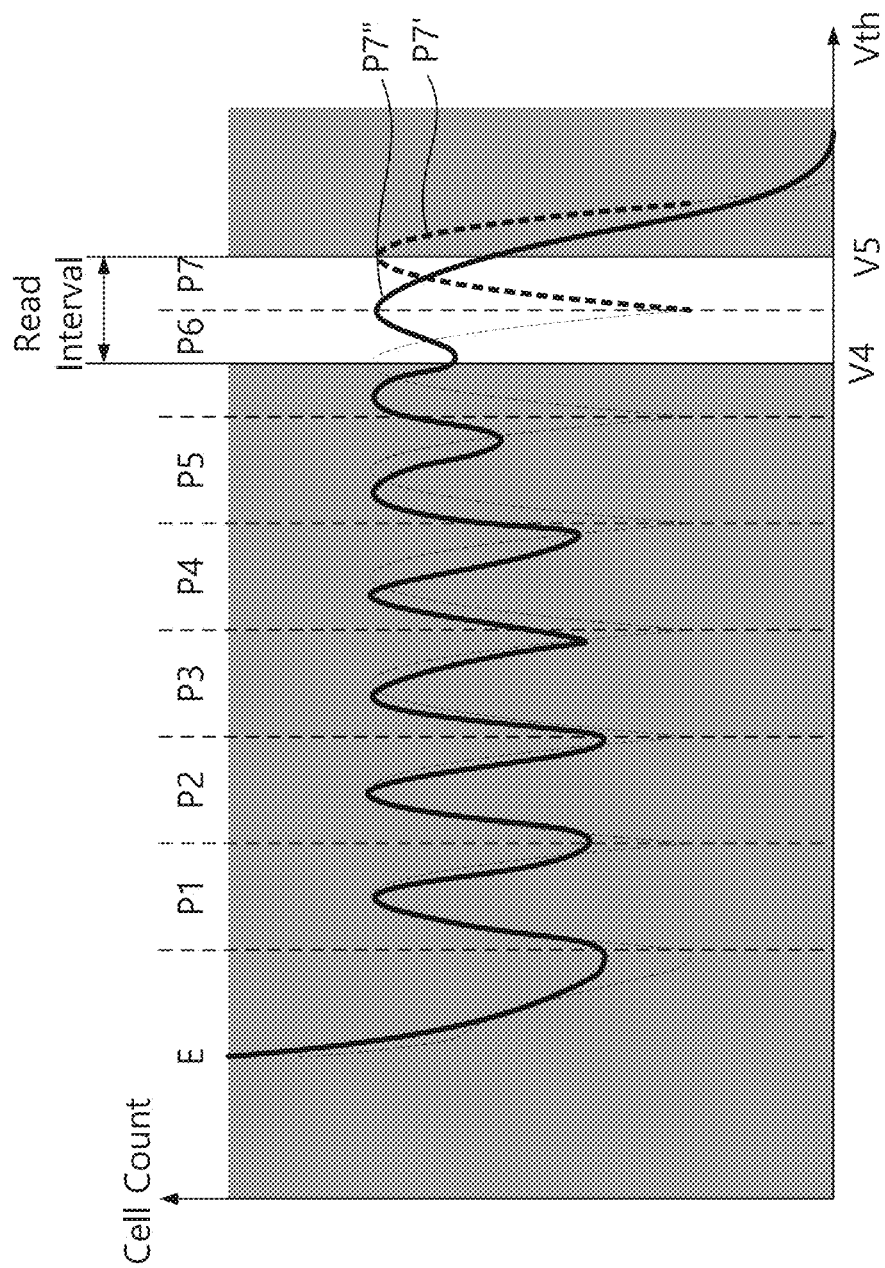

FIGS. 7A, 7B, and 7C are diagrams illustrating examples of an adjusted logging policy according to the present disclosure. Here, for simplicity of description, the threshold voltage distribution of the present disclosure will be described by taking TLC as an example. However, it will be well understood that the advantages of the present disclosure can be equally applied to multi-bit memory cells such as multi-level cell MLC, quad level cell QLC, or more.

Referring to FIG. 7A, a threshold voltage distribution of memory cells implemented with TLC is shown. In the case of TLC, memory cells can be programmed into any one of an erase state E and seven program states P1 to P7. In general, in logging to extract the threshold voltage distribution of the selected memory area of the nonvolatile memory device 1230 in the storage device 1200 (see FIG. 3), the threshold voltage range (V0 to V1) must be read as a voltage interval (ΔV). However, logging to detect distribution of these memory cells takes a lot of time. For example, the logging to detect distribution of each of the program states may use additional resources and require time (e.g., substantial time) to adequately store. Accordingly, obtaining distribution data through telemetry logging has a great adverse effect on performance degradation of the storage device 1200 and quality of service QoS, for example, by requiring resources for the telemetry logging in preference to the memory functions of the storage device 1200 such that performance of the storage device 1200 is affected.

FIG. 7B is a diagram showing a logging method according to some example embodiments of the present disclosure. Referring to FIG. 7B, some example embodiments of distribution of memory cells in which a read disturbance occurs is shown. When a read disturbance occurs, the threshold voltage of the erase state E and the low program states P1 and P2 increases significantly compared to other program states. However, it can be seen that the distribution of the program states P6 and P7 located at high threshold voltages is not significantly affected. Therefore, logging the distribution of the erased state E and the programmed state P1 can sufficiently identify a problem in order to analyze whether read disturbance of memory cells has occurred.

For example, occurrence of read disturbance may be estimated by confirming that the position of a valley between the erased state E and the program state P1 is changed through cell distribution data. Alternatively, the occurrence of read disturbance may be estimated through the rise of the voltage corresponding to the peak of the program state P1 through the cell distribution data. For logging to extract such cell distribution data, logging is possible in the threshold voltage range V2 to V3 including the erased state E and the program state P1, or the position of the distribution valley of these distributions. In this case, the time required for logging to extract all distributions is much reduced.

FIG. 7C is a diagram showing a logging method according to some example embodiments of the present disclosure. Referring to FIG. 7C, a distribution of memory cells deformed by a retention effect is shown as an example. As the program time elapses, the charge of the memory cells decreases, and as a result, the threshold voltage of the memory cells also decreases. This phenomenon appears more remarkably (for example, unusually, or clearly) in memory cells in relatively high program states P6 and P7. Accordingly, it may be sufficient to log the distribution of the program states P6 and P7 in order to analyze whether retention of memory cells has occurred. For example, retention can be determined by detecting the change in voltage corresponding to the peak of the program state P7 or the change in the position of the spread valley between the program states P6 and P7. For this logging, logging is possible in the threshold voltage range V4 to V5 that includes the program state P6 and the program state P7 or the position of the distribution valley of these distributions. In this case, the time required for logging to extract all distributions is much reduced.

Example embodiments of logging methods in the shortened voltage range have been described in FIGS. 7B and 7C. However, the features of the present disclosure are not limited to the disclosure herein. When various events occur, the set feature configuration module 1260 may set a shortened voltage range capable of inferring the corresponding event. In addition, it will be well understood that logging corresponding to various errors or events of the storage device 1200 as well as logging of the threshold voltage may be set to be performed within a reduced characteristic range.

Figure 8:
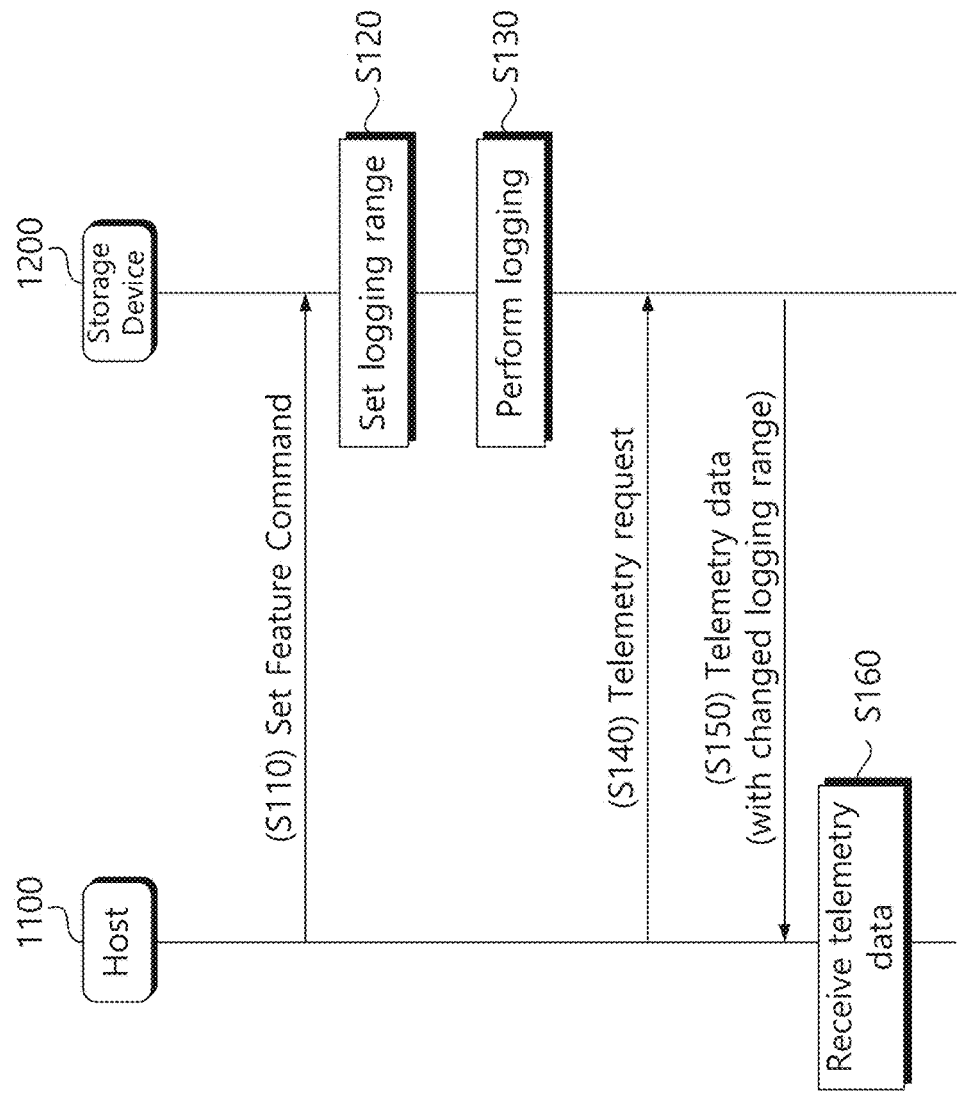
FIG. 8 is a diagram showing a method for collecting telemetry data according to some example embodiments of the present disclosure.

FIG. 8 is a diagram showing a method for collecting telemetry data according to some example embodiments of the present disclosure. Referring to FIG. 8, the host 1100 may set a telemetry logging policy of the storage device 1200 through a set feature command.

In operation S110, the host 1100 transmits a set feature command for setting a range of logging performed when a specific event (e.g., read reclaim) occurs to the storage device 1200. In particular, the host 1100 sets a range of log data to be sampled during logging of the storage device 1200 by using a set feature command.

In step S120, in response to the set feature command, the storage device 1200 adjusts the range of log data sampled during logging. For example, when logging to read threshold voltage distribution data of a memory area where an event has occurred, a voltage range for reading distribution can be set differently according to the event. Taking TLC as an example, in case of an event, logging settings can be performed to read distribution data using the read voltage range corresponding to the erase state and the lowest program state P1. Alternatively, in the case of other events, logging settings may be adjusted to read threshold voltage distribution data using the read voltage range corresponding to the highest program state P7 or the second highest program state P6.

In step S130, the storage device 1200 performs logging according to the logging settings performed in step S120. Logging occurs according to various events occurring during a service operation (e.g., read/write) of the storage device 1200. In particular, in the case of read reclaim, it may occur frequently due to disturbance or retention of memory cells. When read reclaim occurs, the storage device 1200 may extract threshold voltage distribution data only for the read range set for a corresponding memory area. And the extracted information is stored in a specific memory area that stores the log data of the storage device 1200. Depending on the logging settings, logging occurs within a reduced range. Accordingly, a decrease in speed or bandwidth of the storage device 1200 due to logging is prevented or reduced, and deterioration in service quality may be prevented or reduced.

In step S140, a transmission request for telemetry data is generated from the host 1100. The host 1100 transfers the telemetry request to the storage device 1200.

In step S150, in response to the telemetry request, the storage device 1200 transmits log data stored in a specific memory or a specific area to the host 1100 as a telemetry parameter. At this time, the log data corresponds to the logging range set in step S120. Accordingly, the size of the log data is not relatively large, and a decrease in bandwidth due to transmission of the log data or a decrease in service quality of the storage device 1200 due to latency does not occur.

In step S160, the host 1100 receives telemetry data transmitted from the storage device 1200. And the received telemetry data is stored in the designated host storage. Later, at the request of the user or manager, the telemetry data may be used for debugging, analysis, and monitoring.

For example, some example embodiments of procedures for changing the logging configuration of the host 1100 and the storage device 1200 and accordingly changing the logging range have been described. According to the logging method of the present disclosure, the amount of data sampled during logging can be drastically reduced. Therefore, even if logging is performed, the quality of service of the storage device 1200 may be maintained.

FIG. 9A and FIG. 9B are tables showing set feature commands for adjusting the logging settings of FIG. 8 according to some example embodiments of the present disclosure. FIG. 9A shows a Log Page Identifier. And FIG. 9B shows the extended SMART (Self-Monitoring, Analysis, and Reporting Technology) of the present disclosure that can be defined using the spare bytes in the Log Page Identifier. Here, some example embodiments of the application of the present disclosure in the NVMe interface will be described. However, it will be well understood that similar logging settings are possible for various interfaces.

Referring to FIG. 9A, types and scopes of log pages searchable through a Get Log Page command from the host 1100 are illustrated. Information of the log page buffer 1280 (see FIG. 3) in which log pages managed by the storage device 1200 are stored may be returned to the host 1100 through a get log page command.

The log identifier '01h' of the get log page command is used when requesting error information related to the storage controller 1210. When the log identifier included in the get log page command in the host 1100 is '01h', the storage controller 1210 transfers error information related to the storage controller 1210 stored in the log page buffer 1280 to the host 1100. The log identifier '02h' of the get log page command is used when requesting SMART (Self-Monitoring, Analysis, and Reporting Technology) data and health information related to the storage controller 1210 and namespace. When the log identifier included in the get log page command in the host 1100 is '02h', the storage controller 1210 returns the SMART and health information stored in the log page buffer 1280 to the host 1100.

In the log page identifier of the present disclosure, a separate log identifier section for the extended SMART function exists. For example, the identifier 'D0h' corresponding to the Vendor specific section 1400 can be used as a log identifier for extended SMART for logging setting of the present disclosure.

Referring to FIG. 9B, details of the extended SMART of FIG. 9A are shown as an example. First, the extended SMART is allocated to the log page identifier 'D0h' and may consist of 512 bytes. The first byte [0:0] of the extended SMART is assigned the log page identifier 'D0h'. The second byte [1:1] of the extended SMART may be designated as a reserved byte. Flag bits may be allocated to the third to fourth bytes [3:2] of the extended SMART, and log page size information may be allocated to the fifth to eighth bytes [7:4] of the extended SMART. For example, the size of one log page may consist of 512-bytes.

Bytes [375:276] of the extended SMART may be assigned cell distribution information 1450. For example, the cell distribution information 1450 defines that 25 cell counts can be extracted at 0.04V voltage intervals within a corresponding voltage range (e.g., V2 to V3 in FIG. 7B). The illustrated content is only an example, and the number of cell counts or voltage intervals can be freely changed in the logging setting, if necessary.

According to the description of FIGS. 9A and 9B, it can be seen that the range for logging or the size of log data can be set through the set feature command. In particular, for logging setting according to the present disclosure, the host 1100 may freely set the read voltage unit or the number of cell counts for obtaining cell distribution data during logging by utilizing the extended SMART field.

FIG. 10 is an example table showing detailed settings for logging in the set feature command of the present disclosure. Referring to FIG. 10, detailed settings for logging may be defined in a reserved field (e.g., Dword11) of the set feature command. To this end, a setting function may be added to the reserved fields 19h to 77h of the feature identifier in the set feature interface. Here, it is described that 'Dword11' is used as a reserved field of the set feature command, but the present disclosure is not limited thereto. For example, it will be appreciated that any one of the fields Dword12, Dword13, Dword15 may be used.

The bits [07:00] of 'Dword11' are set to log events. For example, when bits [07:00] are provided with a value of '0h', the storage controller 1210 executes logging when a read reclaim occurs during a read operation requested from the host 1100. On the other hand, when bits [07:00] are provided as '1h', the storage controller 1210 executes logging when a read reclaim occurs during a read operation issued by the storage device 1200 itself. In addition, when bits [07:00] are provided with a value of '2h', the storage controller 1200 will execute logging when an uncorrectable error event UECC occurs. Here, various types of events that trigger logging may be added.

The bits [15:08] of 'Dword11' set the range of parameters to be targeted during logging. For example, when '0h' is provided to bits [15:08], the storage controller 1210 is set to perform logging in the voltage range corresponding to the erase state E and the lowest program state P1. Also, when bits [15:08] are provided with a value of '1h', the storage controller 1210 may be set to perform logging in a voltage range corresponding to the least significant bit (LSB) page. That is, logging for extracting the distribution must be performed in the voltage interval for extracting the distribution of the data states (E-P1, P4-P5) corresponding to the LSB page. When bits [15:08] are provided with a value of '2h', the storage controller 1210 may be set to perform logging in a read voltage range corresponding to the most significant bit (MSB) page. That is, logging for extracting the distribution must be performed in the voltage interval for extracting the distribution of the data states (P2-P3 and P6-P7) corresponding to the MSB page. Also, the storage controller 1210 may be set to perform logging in a voltage range corresponding to the highest data state P7 and the second highest data state P6. This is a case where it is determined that the distribution is distorted by retention due to charge leakage. Also, bits [31:16] of 'Dword11' may be maintained as a reserve area.

Some example embodiments of detailed settings in the set feature command has been described above. However, it will be well understood that the above description is only an example and that various events and various detailed logging setting values can be added as needed.

Figure 11:
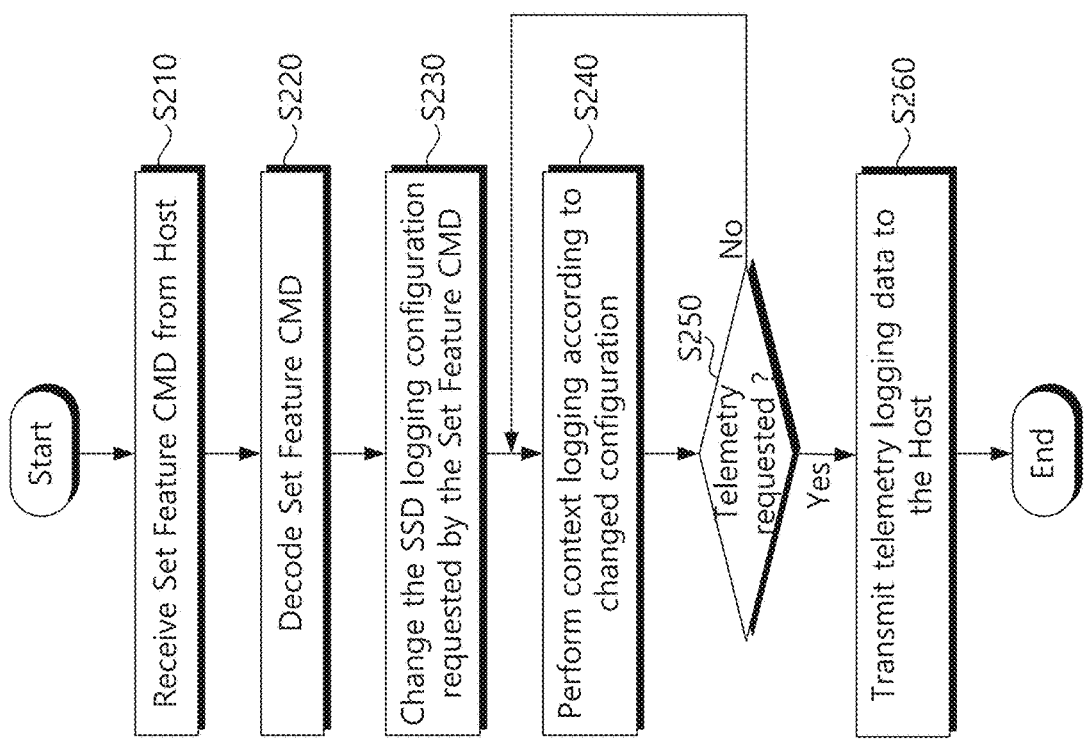
FIG. 11 is a flowchart illustrating a logging configuration process according to a set feature command in a storage device.

FIG. 11 is a flowchart illustrating a logging configuration process according to a set feature command in a storage device. Referring to FIG. 11, in response to a set feature command from the host 1100, the storage device 1200 (see FIG. 4) adjusts (or reduces) a parameter range for context (e.g., distribution data) extraction during logging.

In step S210, when a set feature command is transmitted from the host 1100, the storage controller 1210 receives the set feature command.

In step S220, the set feature configuration module 1260 of the storage controller 1210 decodes the set feature command of the form shown in FIG. 10. That is, the set feature configuration module 1260 extracts an event to which logging is applied and a logging range of the event from the set feature command.

In step S230, the set feature configuration module 1260 adjusts setting parameters for the logging module 1220. For example, in the case of a read reclaim event, the logging module 1220 may be set to perform logging in a voltage range corresponding to the erase state E and the lowest program state P1. In addition, the logging module 1220 may be set to perform logging with reduced read voltage ranges corresponding to various events.

In step S240, the setting-completed logging module 1220 executes context logging. If read reclaim occurs, distribution data extraction may be performed at a set read interval in the reset reduced voltage range. The context (e.g., distribution data) extracted during logging is stored in the log page buffer 1280.

In step S250, it is checked whether a telemetry request from the host 1100 is received. If there is a request for telemetry from the host 1100 (direction 'Yes'), the procedure moves to step S260. On the other hand, if there is no telemetry request from the host 1100 ('No' direction), the procedure returns to step S240 and continues logging.

In step S260, the storage controller 1210 transmits the log data stored in the log page buffer to the host 1100 in response to the telemetry request.

Some example embodiments of the procedure for setting logging and transmitting telemetry in the storage device 1200 according to some example embodiments of the present disclosure have been described. The storage device 1200 may reduce the logging range according to the set feature command provided by the host 1100. Accordingly, resources required for logging can be greatly reduced, and the quality of service of the storage device 1200 can be maintained.

Figure 12:
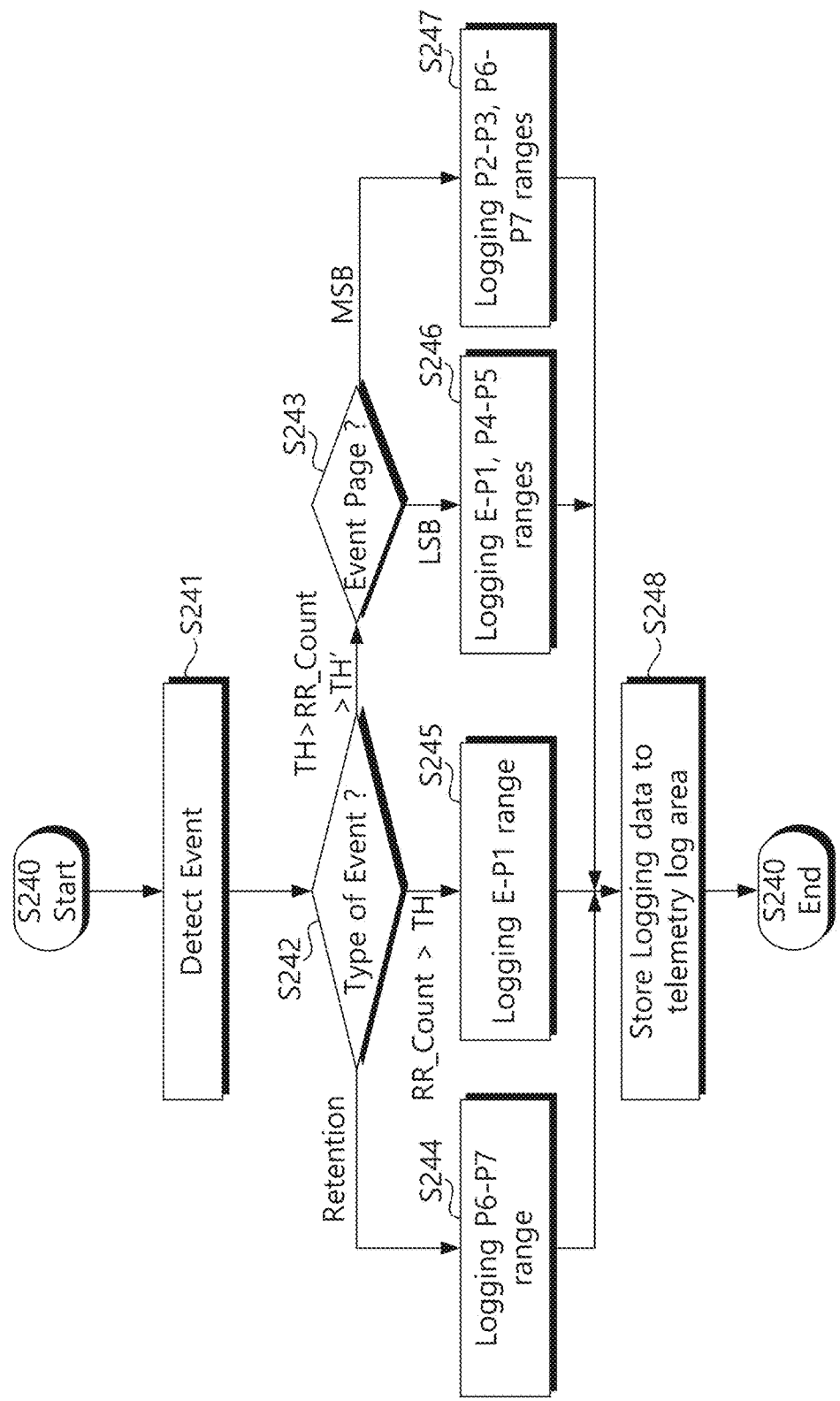
FIG. 12 is a flowchart showing an example of step S240 of FIG. 11.

FIG. 12 is a flowchart showing an example of step S240 of FIG. 11. Referring to FIG. 12, the logging module 1220 whose setting has been changed according to some example embodiments of the present disclosure may select a different logging range according to an event that has occurred.

In step S241, the logging module 1220 of the storage controller 1210 starts detecting an event for logging. The event at this time may be a value set by a set feature command.

In step S242, the logging module 1220 performs operation branching according to the type of the detected event. If an event corresponding to retention is detected ('Retention' direction), the procedure moves to step S244. On the other hand, if it is detected that the read reclaim count RR_Count is greater than the first threshold TH (RR_Count>TH), the procedure proceeds to step S245. Further, when it is detected that the read reclaim count RR_Count is smaller than the first threshold value TH and greater than the second threshold value TH' (TH>RR_Count>TH'), the process proceeds to step S243. In step S243, an operation branch additionally occurs depending on whether the page where the event occurred is the LSB or the MSB.

In step S244, the logging module 1220 performs logging in a read voltage range corresponding to the next higher data state P6 and the highest data state P7. At this time, the logging module 1220 may perform cell count 25 times at intervals of 0.04V in the selected read voltage range.

In step S245, the logging module 1220 performs logging in the read voltage range corresponding to the erase state E and the lowest program state P1. For example, at this time, the logging module 1220 will perform cell count 25 times at intervals of 0.04V in the selected read voltage range.

In step S246, the logging module 1220 may perform logging in the read voltage range corresponding to the LSB page. In some example embodiments, the logging module 1220 will perform logging for extracting the distribution in the read voltage section for extracting the distribution of the data states E-P1 and P4-P5. For example, at this time, the logging module 1220 will perform a total of 50 cell counts 25 times at 0.04V intervals in the selected read voltage range.

In step S247, the logging module 1220 may perform logging in a read voltage range corresponding to the MSB page. In some example embodiments, the logging module 1220 will perform logging for extracting the distribution in the read voltage section for extracting the distribution of the data states P2-P3 and P6-P7. For example, at this time, the logging module 1220 will perform a total of 50 cell counts 25 times at 0.04V intervals in the selected read voltage range.

In step S248, the logging module 1220 stores the collected log data in the log page buffer 1280. Log data stored in the log page buffer 1280 may be returned to the host 1100 in response to a telemetry request from the host 1100.

The size of log data can be reduced by selecting the logging range corresponding to the event described above in some example embodiments. Thus, according to the logging method of the present disclosure, it is expected that the quality of service of the storage device 1200 can be maintained by reducing the resources required for logging. For example, the example embodiments of the present disclosure may improve storage utilization (for example, by reducing storage of logging ranges), improve processing utilization (for example, by limiting resources required to manage and monitor logging), improve energy usage, improve network utilization (for example, by transmitting/receiving the reduced partial logging range data) of the storage device 1200 and/or other components.

Figure 13:
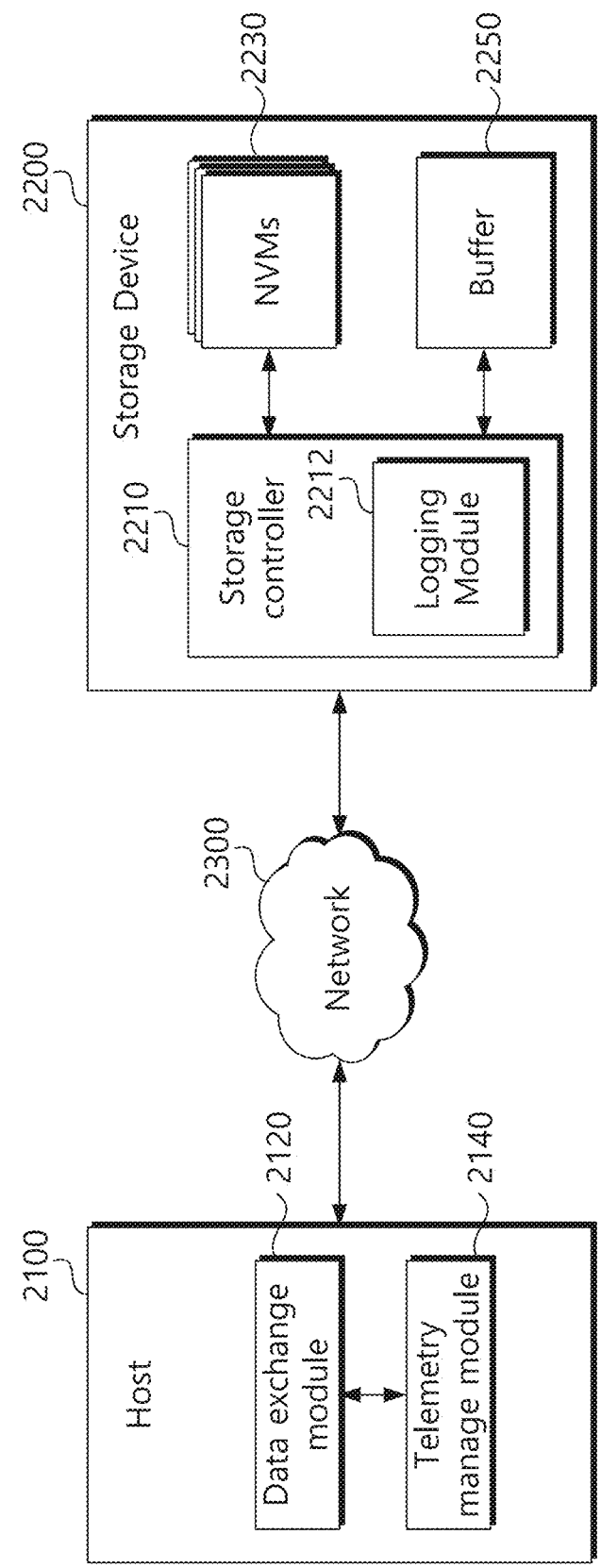
FIG. 13 is a block diagram showing a storage system according to some example embodiments of the present disclosure.

FIG. 13 is a block diagram showing a storage system 2000 according to some example embodiments of the present disclosure. Referring to FIG. 13, a storage system 2000 may include a host 2100, a storage device 2200, and a network 2300.

The host 2100 accesses the storage device 2200 through the network 2300 and requests telemetry data. The host 2100 may receive telemetry data transmitted from the storage device 2200 and provide it to a manager. To request and receive telemetry data, the host 2100 may include a data exchange module 2120 and a telemetry management module 2140 for requesting and receiving telemetry data. The interface used in the data exchange module 2120 may be at least one of NVMe, NVMe over Fabrics (NVMe-oF), and NVMe-Management Interface (NVMe-MI).

The storage device 2200 may be provided as a storage medium of a server or data center. The storage device 2200 writes data to the nonvolatile memory device 2230 or reads stored data in response to various data write and read requests. The storage device 2200 may include a storage controller 2210, a nonvolatile memory device 2230, and a buffer 2250.

The storage controller 2210 may perform logging in a reduced logging range without logging settings from the host 2100. For example, the storage controller 2210 includes a logging module 2212 that automatically selects a logging range corresponding to an event from the host 2100. When an event such as read reclaim occurs, the logging module 2212 may log cell distribution for a corresponding memory area. At this time, the logging module 2212 of the present disclosure performs logging not for the entire threshold voltage range in which states are distributed, but for a partial range in which the cause of the event can be identified.

Some example embodiments, the storage device 2200 of the present disclosure may be configured to log only a partial range in which the cause of a problem can be analyzed in the case of logging that causes performance degradation. Accordingly, when an event such as read reclaim occurs, the cell distribution may be logged and transmitted only in a partial voltage range, and thus logging may be performed without degradation of performance of the storage device 2200. For example, the example embodiments of the present disclosure may improve storage utilization (for example, by reducing storage of logging ranges), improve processing utilization (for example, by limiting resources required to manage and monitor logging), improve energy usage, improve network utilization (for example, by transmitting/receiving the reduced partial logging range data) of the storage device 2200 and/or other components.

Figure 14:
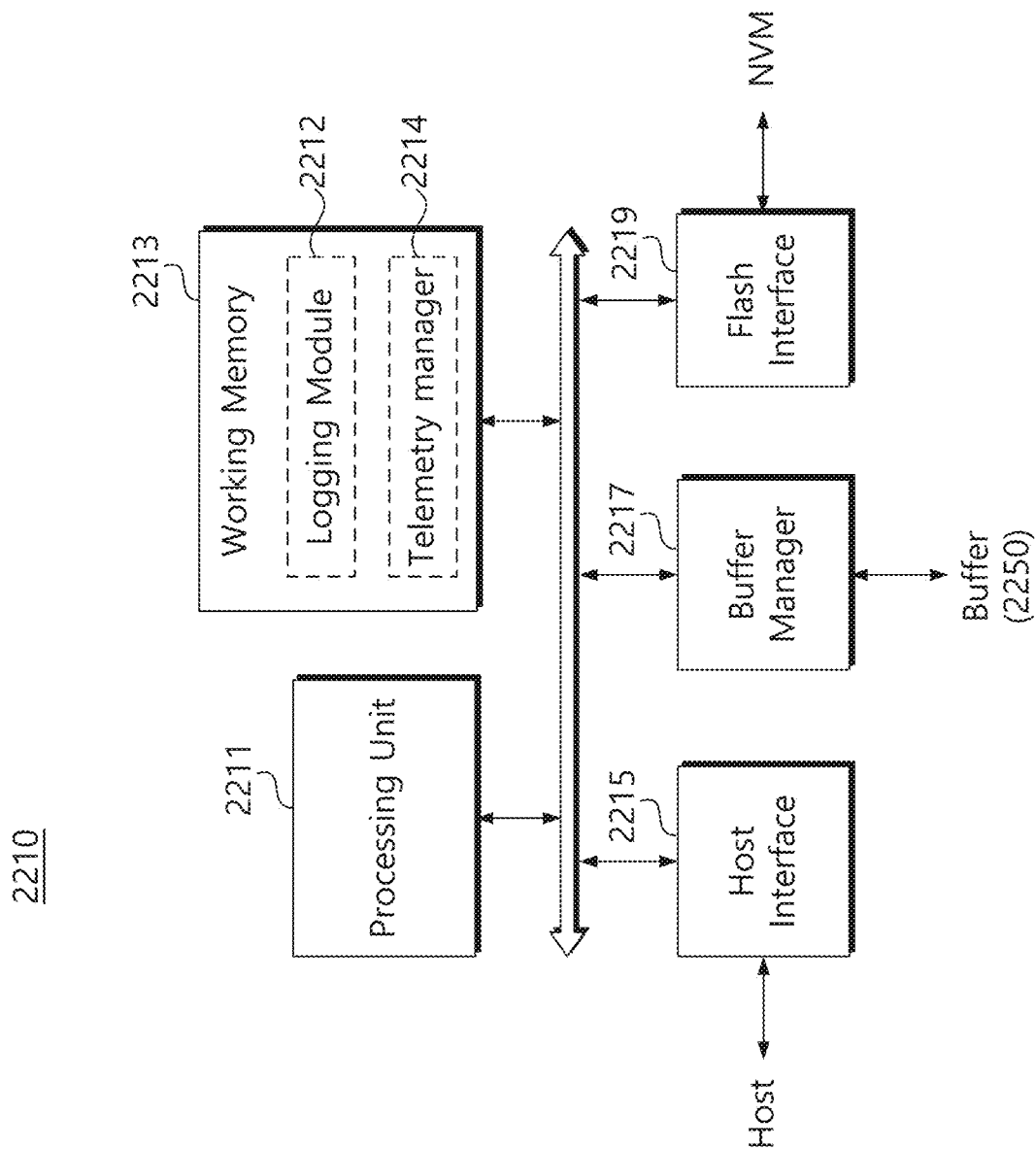
FIG. 14 is a block diagram showing the configuration of the storage controller of FIG. 13.

FIG. 14 is a block diagram showing the configuration of the storage controller of FIG. 13. Referring to FIG. 14, a storage controller 2210 of the present disclosure includes a processing unit 2211, a working memory 2213, a host interface 2215, a buffer manager 2217, and a flash interface 1219. Here, the host interface 2215 and the flash interface 2219 is substantially the same as the correlated features of FIG. 4. Therefore, a description of these will be omitted.

The processing unit 2211 may drive software loaded into the working memory 2213. For example, the processing unit 2211 executes a logging module 2212 and a telemetry manager 2214.

Software (or firmware) or data for controlling the storage controller 2210 is loaded into the working memory 2213. Software and data loaded into the working memory 2213 are driven or processed by the processing unit 2211. In particular, according to some example embodiments of the present disclosure, the logging module 2212 and the telemetry manager 2214 may be loaded into the working memory 2213. Alternatively, a flash translation layer FTL including functions of the logging module 2212 and the telemetry manager 2214 may be loaded. The working memory 2213 does not include a separate module for setting logging conditions by executing the set feature command.

The logging module 2212 driven by the processing unit 2211 collects and stores log data related to events occurring in the nonvolatile memory device 1230. For example, when an event such as read reclaim occurs, the logging module 2212 may perform logging to collect distribution data for a corresponding memory area (memory block or page). In this case, the logging module 2212 may log only a distribution of threshold voltages within a range related to a specific event, among distributions of threshold voltages corresponding to respective data states.

The logging module 2212 may log the distribution of the threshold voltage range including the erase state E or the program state P1 when read reclaim occurs. On the other hand, if retention is suspected, the logging module 2212 may log the distribution of the voltage range including at least one of the program states P6 and P7. That is, when an event occurs, the logging module 2212 may log voltage ranges corresponding to partial states or distribution valleys rather than distribution of all data states. That is, the logging module 2212 may limit the voltage range for collecting distribution data to only a section corresponding to some data states.

The telemetry manager 2214 stores log pages collected by the logging module 2212 in the buffer 2250. When a telemetry request is generated from the host 2100, the telemetry manager 2214 transfers the log page stored in the buffer 2250 to the host 2100.

The buffer manager 2217 controls the input/output of the buffer 2250. The buffer manager 2217 performs an input/output control operation of the buffer 2250 for buffering read data or write data moving between the host interface 2215 and the flash interface 2219. In addition, a portion of the buffer 2250 may serve as a log page buffer. Log pages extracted by logging performed by the logging module 2212 are stored in a log page buffer. Log pages stored by the telemetry manager 2214 may be returned to the requested host 2100.

Some example embodiments of the storage controller 2210 have been described above. According to the function of the storage controller 2210 of the present disclosure, a logging policy set as default may log a distribution of some states or distribution goals rather than distribution of all data states according to an event. That is, the logging module 2212 may limit the range of read voltages for collecting distribution data only to sections corresponding to some data states. Accordingly, performance degradation or service quality degradation of the storage device 2200 caused by logging does not occur.

Figure 15:
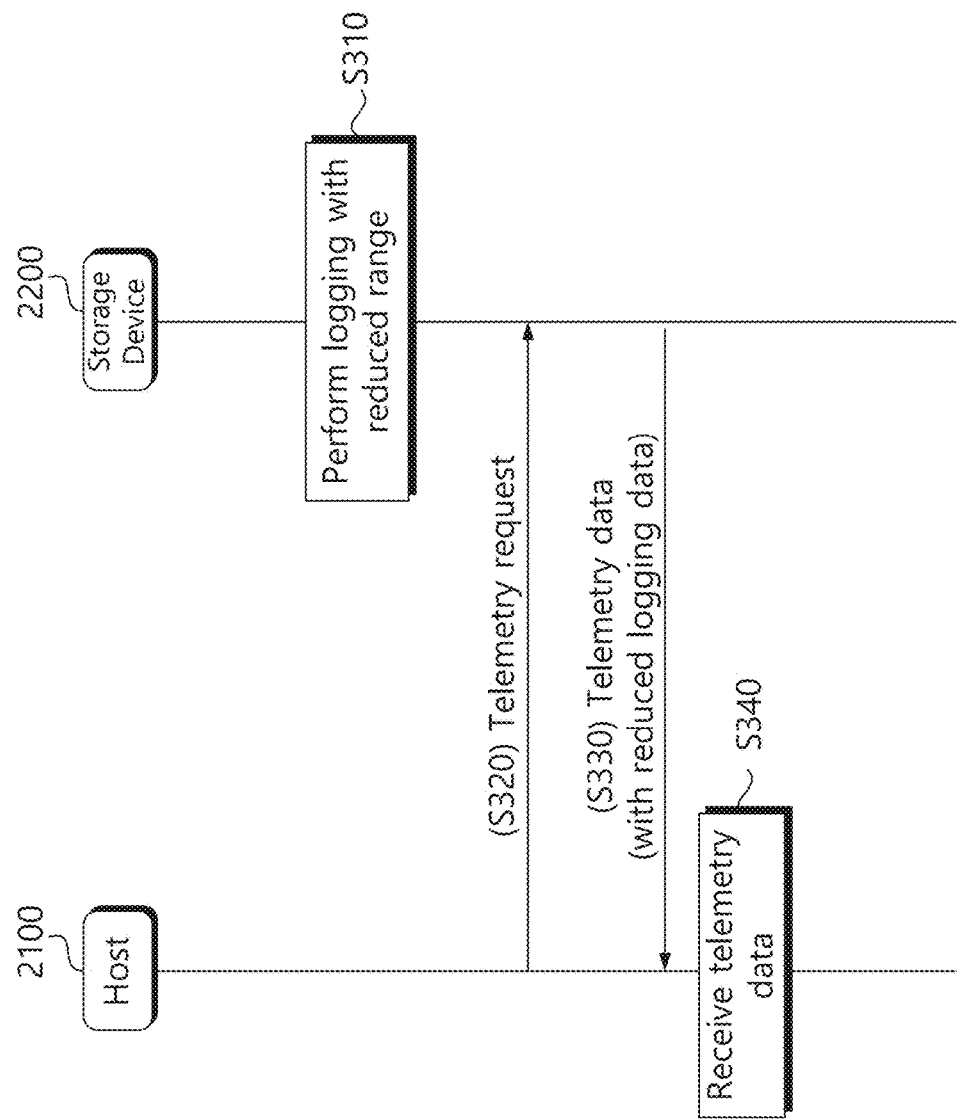
FIG. 15 is a diagram illustrating a method of collecting telemetry data according to some example embodiments of the present disclosure.

FIG. 15 is a diagram illustrating a method of collecting telemetry data according to some example embodiments of the present disclosure. Referring to FIG. 15, the storage device 2200 may provide telemetry data collected in a reduced logging range without a set feature command.

In step S310, the logging module 2212 of the storage device 2200 performs logging in the reduced logging range. Logging may occur according to various events occurring during a service operation (e.g., read/write) of the storage device 2200. In particular, in the case of read reclaim, it may occur frequently depending on the effect of disturbance or retention of memory cells. When read reclaim occurs, the logging module 2212 may extract distribution data only for a reduced read range for a corresponding memory area. And the extracted distribution data is stored in a log page buffer area provided in the buffer 2250. The logging module 2212 samples log data in a reduced range when logging the selected memory area. Therefore, the speed or bandwidth of the storage device 2200 hardly decreases due to logging, and the quality of service can be maintained.

In step S320, a transmission request for telemetry data is generated from the host 2100. The host 2100 transfers the telemetry request to the storage device 2200.

In step S330, in response to the telemetry request, the storage device 2200 transmits log data stored in a log page buffer to the host 2100 as a telemetry parameter. At this time, the log data is data sampled in the reduced logging range. Accordingly, the size of the log data is not relatively large, and a decrease in bandwidth due to transmission of the log data or a decrease in service quality of the storage device 2200 due to latency does not occur.

In step S340, the host 2100 receives telemetry data transmitted from the storage device 2200. Also, the received telemetry data is stored in a designated memory area. Later, at the request of the user or manager, the telemetry data will be used for debugging, analysis, and monitoring.

Some example embodiments in which logging is performed in a reduced logging range of the storage device 2200 itself without changing logging settings have been described. According to the logging method of the present disclosure, the amount of data sampled during logging can be drastically reduced. Therefore, even if logging is performed, the quality of service of the storage device 2200 may be maintained. For example, the example embodiments of the present disclosure may improve storage utilization (for example, by reducing storage of logging ranges), improve processing utilization (for example, by limiting resources required to manage and monitor logging), improve energy usage, improve network utilization (for example, by transmitting/receiving the reduced partial logging range data) of the storage device 2200 and/or other components.

As described herein, any electronic devices and/or portions thereof according to any of the example embodiments may include, may be included in, and/or may be implemented by one or more instances of processing circuitry such as hardware including logic circuits; a hardware/software combination such as a processor executing software; or any combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device (e.g., a memory), for example a DRAM device, storing a program of instructions, and a processor (e.g., CPU) configured to execute the program of instructions to implement the functionality and/or methods performed by some or all of any devices, systems, modules, units, controllers, circuits, architectures, and/or portions thereof according to any of the example embodiments, and/or any portions thereof.

The above are specific embodiments for carrying out the present disclosure. In addition to the above-described embodiments, the present disclosure may include simple design changes or easily changeable embodiments. In addition, the present disclosure will include techniques that can be easily modified and implemented using some example embodiments. Therefore, the scope of the present disclosure should not be limited to the above-described embodiments, and should be defined by the claims and equivalents of the claims of the present disclosure as well as the claims to be described later.

What is claimed is:

1. A storage device, the device comprising:
a nonvolatile memory device configured to store data; and
a storage controller configured to
perform logging for a selected memory area of the nonvolatile memory device in response to an event based on receiving a telemetry request from a host, and
transmit log data collected by the logging in response to the telemetry request,
the storage controller including
a logging module configured to
sample distribution data of a voltage range of a selected program state or bit page corresponding to the event during the logging, and
provide the sampled distribution data as the log data;
a set feature configuration module configured to set the voltage range corresponding to a type of the event according to a set feature command from the host; and
a telemetry data management module configured to transmit the log data collected to the host according to the telemetry request.

2. The device of claim 1, wherein
the logging module is configured to log cell threshold voltage distribution of the selected memory area in a voltage range corresponding to an erase state and a lowest program state based on the event corresponding to a read reclaim.

3. The device of claim 1, wherein the logging module is configured to
log cell threshold voltage distribution of the selected memory area in a voltage range corresponding to program states or erase states having data states of a least significant bit page based on the event corresponding to a read reclaim of the least significant bit page.

4. The device of claim 1, wherein the logging module is configured to log cell threshold voltage distribution of the selected memory area in a voltage range corresponding to a program state having a data state of a most significant bit page based on the event corresponding to a read reclaim of the most significant bit page.

5. The device of claim 1, wherein the logging module is configured to log cell threshold distribution of the selected memory area in a voltage range corresponding to a highest program state or a second highest program state based on the event corresponding to a data retention phenomenon.

6. The device of claim 1, wherein the storage device includes a log page buffer configured to store the log data collected by the logging.

7. The device of claim 6, wherein the set feature command is configured to use reserved fields of a vendor specific field among log page identifiers of a Get Log Page command.

8. The device of claim 1, wherein the storage controller includes a host interface corresponding to at least one of NVMe, NVMe-oF, and NVM-MI interface protocols.

9. A storage system, comprising:
a storage device including a nonvolatile memory device and configured to collect log data by performing logging on the nonvolatile memory device; and
a host device configured to communicate with the storage device through a network and obtain the log data by transmitting a telemetry request to the storage device,
wherein the host device is configured to control the storage device to
log a cell distribution in a voltage range corresponding to some of data states of a selected program state or bit page of a selected memory area using a set feature command, and provide the log data as log data,
select the voltage range according to a type of event occurring in the storage device, and
log the cell distribution of the selected memory area in a voltage range corresponding to a program state having a data state of a most significant bit page based on the event corresponding to a read reclaim of the most significant bit page.

10. The system of claim 9, wherein the host device is configured to control the storage device to log the cell distribution of the selected memory area in a voltage range corresponding to an erase state and a lowest program state based on the event corresponding to a read reclaim.

11. The system of claim 9, wherein the host device is configured to control the storage device to log the cell distribution of the selected memory area in a voltage range corresponding to program states or erase states having data states of a least significant bit page based on the event corresponding to a read reclaim of the least significant bit page.

12. The system of claim 9, wherein the host device is configured to control the storage device to log the cell distribution of the selected memory area in a voltage range corresponding to a highest program state or a second highest program state based on the event corresponding to a data retention phenomenon.

13. A logging method of a storage device having a nonvolatile memory device, comprising:
receiving a set feature command provided from a host;
setting a logging policy to log distribution data of a voltage range corresponding to some data states of a selected program state or bit page of the nonvolatile memory device according to the set feature command; and
performing logging for the nonvolatile memory device according to the set logging policy,
wherein the some of the data states is determined according to an event occurring in a storage state,
wherein based on the event corresponding to a read reclaim of a least significant bit page, the some of the data states includes a program state or an erase state corresponding to the least significant bit page; and
wherein based on the event corresponding to a read reclaim of a most significant bit page, the some of the data states includes a program state corresponding to the most significant bit page.

14. The method of claim 13, wherein based on the event corresponding to a read reclaim, the some of the data states includes an erased state or a lowest program state.

15. The method of claim 13, wherein based on the event corresponding to a data retention phenomenon, the some of the data states includes a highest program state or a second highest program state.

16. The method of claim 13, further comprising:
transmitting log data collected as a result of the logging to the host in response to a telemetry request from the host.

* * * * *